United States Patent
Asai et al.

(10) Patent No.: US 12,025,676 B2
(45) Date of Patent: Jul. 2, 2024

(54) DEVICE FOR ASSESSING DEGREE OF DEGRADATION OF SECONDARY BATTERY AND ASSEMBLED BATTERY

(71) Applicant: DENSO CORPORATION, Kariya (JP)

(72) Inventors: Tomomi Asai, Kariya (JP); Nobuo Yamamoto, Kariya (JP); Hiroyasu Suzuki, Kariya (JP); Katsuki Hayashi, Kariya (JP); Yuya Minabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 204 days.

(21) Appl. No.: 17/585,936

(22) Filed: Jan. 27, 2022

(65) Prior Publication Data

US 2022/0146590 A1 May 12, 2022

Related U.S. Application Data

(63) Continuation of application No. PCT/JP2020/028354, filed on Jul. 22, 2020.

(30) Foreign Application Priority Data

Aug. 1, 2019 (JP) ................. 2019-142579
Jun. 30, 2020 (JP) ................. 2020-113169

(51) Int. Cl.
*G01R 31/392* (2019.01)
*G01R 31/396* (2019.01)
*H01M 10/42* (2006.01)

(52) U.S. Cl.
CPC ......... *G01R 31/392* (2019.01); *G01R 31/396* (2019.01); *H01M 10/42* (2013.01)

(58) Field of Classification Search
None
See application file for complete search history.

(56) References Cited

U.S. PATENT DOCUMENTS

2012/0169288 A1  7/2012 Ueki et al.
2012/0316814 A1* 12/2012 Rahaman ............ G01R 31/392
                                                            702/63

(Continued)

FOREIGN PATENT DOCUMENTS

DE   102015016987 A1   8/2016
JP    2012220199 A    11/2012

(Continued)

OTHER PUBLICATIONS

Wang Limei et al.: "On-board state of health estimation of LiFePO4 battery pack through differential voltage analysis", Applied Energy, Elsevier Science Publishers, GB, vol. 168, Feb. 12, 2016, pp. 465-472.

(Continued)

*Primary Examiner* — Jas A Sanghera
(74) *Attorney, Agent, or Firm* — Harness, Dickey & Pierce, P.L.C.

(57) ABSTRACT

A degradation degree assessment device for a secondary battery is to assess a degree of degradation of a secondary battery and includes a battery characteristic acquisition unit, a capacity estimation unit, and an assessment unit. The battery characteristic acquisition unit acquires a battery characteristic relating to a voltage transition of the secondary battery in a predetermined voltage section. The assessment unit assesses the degree of degradation of the secondary battery based on the battery characteristic acquired by the battery characteristic acquisition unit or based on a battery characteristic-related value computed on the basis of the battery characteristic.

26 Claims, 22 Drawing Sheets

(56) References Cited

U.S. PATENT DOCUMENTS

| | | | |
|---|---|---|---|
| 2013/0063080 A1 | 3/2013 | Shiraishi | |
| 2013/0314050 A1 | 11/2013 | Matsubara et al. | |
| 2014/0218042 A1 | 8/2014 | Koba et al. | |
| 2014/0269811 A1* | 9/2014 | Maleki | G01K 15/005 374/1 |
| 2014/0336964 A1 | 11/2014 | Okumura et al. | |
| 2016/0013669 A1 | 1/2016 | Shiraishi | |
| 2016/0061908 A1 | 3/2016 | Torai et al. | |
| 2016/0105044 A1* | 4/2016 | Yamaguchi | H02J 7/0013 320/112 |
| 2016/0187428 A1* | 6/2016 | Basu | G01R 31/367 702/63 |
| 2016/0195589 A1 | 7/2016 | Hanyu et al. | |
| 2016/0204639 A1 | 7/2016 | Honkura et al. | |
| 2017/0212170 A1 | 7/2017 | Torai et al. | |
| 2018/0222343 A1* | 8/2018 | Uchida | G06Q 30/0631 |
| 2018/0269540 A1 | 9/2018 | Tanaka et al. | |
| 2018/0299511 A1* | 10/2018 | Kim | G01R 31/367 |
| 2019/0113577 A1 | 4/2019 | Severson et al. | |

FOREIGN PATENT DOCUMENTS

| | | |
|---|---|---|
| JP | 2016176924 A | 10/2016 |
| JP | 2016225306 A | 12/2016 |
| JP | 2018022650 A | 2/2018 |
| JP | 2019022286 A | 2/2019 |
| WO | WO-2012137456 A | 10/2012 |
| WO | WO-2013115038 A1 | 8/2013 |
| WO | WO-2015041091 A1 | 3/2015 |

OTHER PUBLICATIONS

Weng Caihao et al.: "State-of-health monitoring of lithium-ion battery modules and packs via incremental capacity peak tracking", Applied Energy, Elsevier Science Publishers, GB, vol. 180, Aug. 4, 2016, pp. 360-368.

Honkura Kohei et al.: "Study of the deterioration mechanism of LiCoO2/graphite cells in charge/discharge cycles using the discharge curve analysis", Journal of Power Sources, vol. 264, Apr. 18, 2014, pp. 140-146.

Hou Chaoyong et al.: "An online calibration algorithm of SOC for LiFePO4 battery by using characteristic curve", 2015 5th International Conference on Electric Utility Deregulation and Restructuring and Power Technologies (DRPT), IEEE, Nov. 26, 2015, pp. 2108-2112.

Christophersen J P et al.: "Using radial basis functions to approximate battery differential capacity and differential voltage", Journal of Power Sources, Elsevier, Amsterdam, NL, vol. 195, No. 4, Feb. 15, 2010, pp. 1225-1234.

Weixiong Wu et al.: "Low-temperature reversible capacity loss and aging mechanism in lithium-ion batteries for different discharge profiles", International Journal of Energy Research, Wiley, Chichester, GB, vol. 43, No. 1, Oct. 18, 2018, pp. 243-253.

Han Xuebing et al.: "A comparative study of commercial lithium ion battery cycle life in electrical vehicle: Aging mechanism identification", Journal of Power Sources, Elsevier, Amsterdam, NL, vol. 251, Nov. 23, 2013, pp. 38-54.

* cited by examiner (a)

(b)

DEVICE FOR ASSESSING DEGREE OF DEGRADATION OF SECONDARY BATTERY AND ASSEMBLED BATTERY

CROSS REFERENCE TO RELATED APPLICATION

The present application is a continuation application of International Patent Application No. PCT/JP2020/028354 filed on Jul. 22, 2020, which designated the U.S. and claims the benefit of priority from Japanese Patent Applications No. 2019-142579 filed on Aug. 1, 2019 and No. 2020-113169 filed on Jun. 30, 2020. The entire disclosures of all of the above applications are incorporated herein by reference.

TECHNICAL FIELD

The present disclosure relates to a device for assessing a degree of degradation of a secondary battery, and an assembled battery.

BACKGROUND

Conventionally, assembled batteries have been widely used. Each of the assembled batteries includes a plurality of secondary battery modules.

SUMMARY

According to an aspect of the present disclosure, a degradation degree assessment device is for a secondary battery to assess a degree of degradation of the secondary battery.

BRIEF DESCRIPTION OF THE DRAWINGS

The above-described object and other objects, features, and advantages of the present disclosure will become more apparent from the following detailed description that is given with reference to the accompanying drawings, in which.

DETAILED DESCRIPTION

Figure 1:
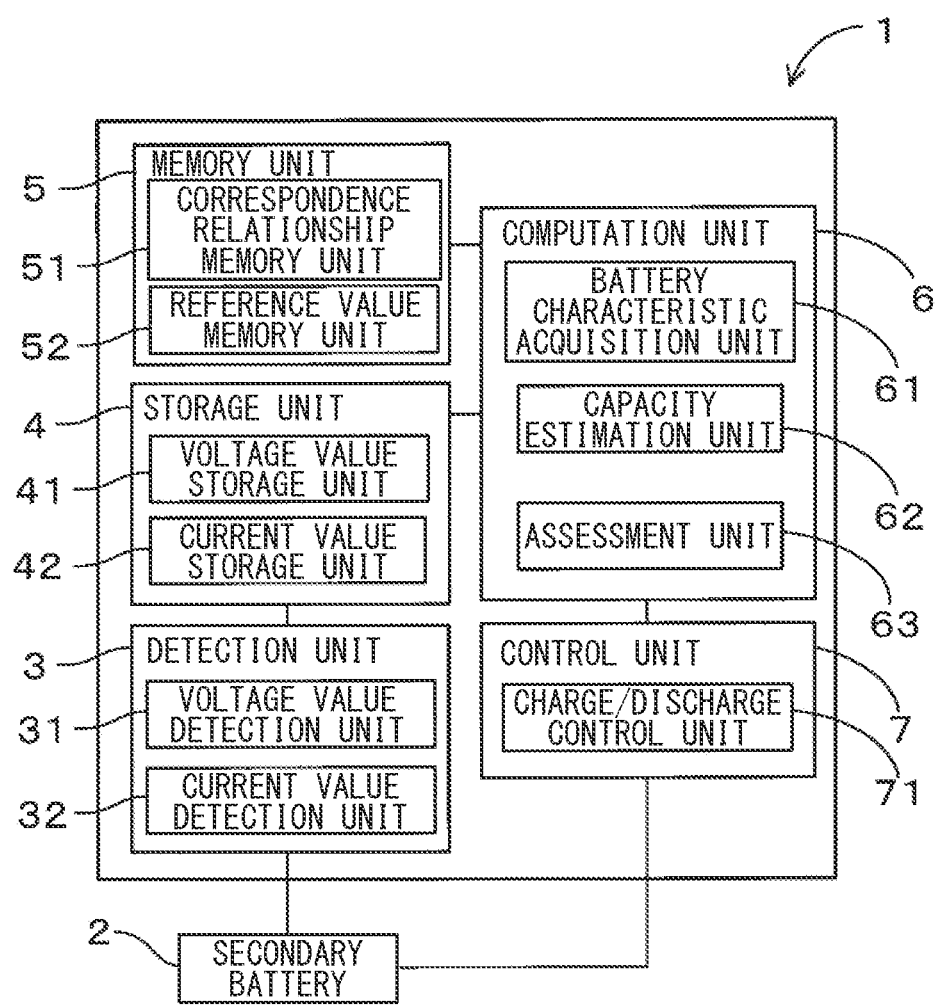
FIG. 1 is a conceptual diagram showing a configuration of a degradation degree assessment device according to a first embodiment.

Hereinafter, examples of the present disclosure will be described.

According to an example of the present disclosure, an assembled battery includes a plurality of secondary battery modules that are combined with each other. When an assembled battery is in use, the secondary battery modules become degraded, and variations may occur in the degree of degradation among the secondary battery modules. Therefore, even when only a part of the secondary battery modules in the assembled battery have a degree of degradation exceeding a criterion, the assembled battery, as a whole, may become unusable, even though remainder of the secondary battery modules have a degree of degradation less than the criterion.

An assumable practice in such cases is to take out a less degraded and usable secondary battery module from the assembled battery in order to reuse such secondary battery module. For example, a configuration for detecting the degree of degradation of a secondary battery module in an assembled battery is assumable. Specifically, an assembled battery is discharged until the state of charge (SOC) thereof becomes equal to or less than a lower limit value of a predetermined normal use range, and then the individual secondary battery modules are taken out to detect their remaining capacities. Then, the capacity difference between secondary battery modules is computed and compared with a threshold. If the capacity difference is equal to or greater than a predetermined value, the remaining lifetime of the secondary battery module having a smaller capacity is regarded as equal to or less than a predetermined value, whereby the degrees of degradation of the individual secondary battery modules are assessed.

In the case of the assumable configuration, the remaining lifetime, that is, the degree of degradation may not be derived with high accuracy when variations in the degree of degradation among secondary battery modules included in an assembled battery are small. For example, when the degrees of degradation of all the secondary battery modules included in the assembled battery are high or low, variations in the degree of degradation are less likely to occur, and thus the degree of degradation is detected with lower accuracy. On the other hand, in a case where secondary battery modules are taken out from an assembled battery to separately assess the individual degrees of degradation, a configuration therefor tends to be complicated.

An example of the present disclosure provides a degradation degree assessment device that is for a secondary battery to assess a degree of degradation of the secondary battery. The degradation degree assessment device comprises: a battery characteristic acquisition unit configured to acquire a battery characteristic relating to a transition of a battery state in a predetermined voltage section of the secondary battery; and an assessment unit configured to assess the degree of degradation of the secondary battery based on the battery characteristic acquired by the battery characteristic acquisition unit or based on a battery characteristic-related value computed based on the battery characteristic.

An example of the present disclosure provides an assembled battery comprising a plurality of secondary batteries. The secondary batteries include a recycled product. In the secondary batteries, a battery characteristic or a battery characteristic-related value is within a predetermined range. The battery characteristic relates to a transition of a battery state of each of the secondary batteries in a predetermined voltage section. The battery characteristic-related value is computed based on the battery characteristic.

The degradation degree assessment device of the one aspect assesses the degree of degradation of a secondary battery on the basis of a battery characteristic or a battery characteristic-related value relating to a voltage transition in a predetermined voltage section as acquired from the secondary battery. Therefore, the degree of degradation can be assessed in a simple process. Furthermore, as the voltage section from which a battery characteristic of the secondary battery is to be acquired, a voltage section that exhibits a high correlation between the voltage transition and the degree of degradation of the secondary battery is set. Therefore, the degree of degradation of the secondary battery can be assessed with high accuracy.

In addition, the assembled battery of the above-described other aspect is assembled such that the individual battery characteristics or the battery characteristic-related values are within a predetermined range. As a result, variations in battery characteristics of the secondary batteries included in the assembled battery are reduced, and thus the assembled battery has a longer lifetime.

As described above, according to one aspect of the present disclosure, it is possible to provide the degradation degree assessment device for a secondary battery capable of assessing the degree of degradation with high accuracy in a simple configuration. In addition, according to the other aspect of the present disclosure, an assembled battery having an extended lifetime can be provided.

First Embodiment

An embodiment of the degradation degree assessment device for a secondary battery will be now described with reference to FIGS. 1 to 4.

As shown in FIG. 1, a degradation degree assessment device 1 for a secondary battery is intended to assess the degree of degradation of a secondary battery 2 and includes a battery characteristic acquisition unit 61 and an assessment unit 63.

The battery characteristic acquisition unit 61 acquires a battery characteristic relating to a voltage transition of the secondary battery 2 in a predetermined voltage section.

The assessment unit 63 assesses the degree of degradation of the secondary battery 2 based on the battery characteristic acquired by the battery characteristic acquisition unit 61 or based on a battery characteristic-related value computed on the basis of the battery characteristic.

The following describes the degradation degree assessment device 1 for a secondary battery according to the present embodiment in detail.

Figure 4:
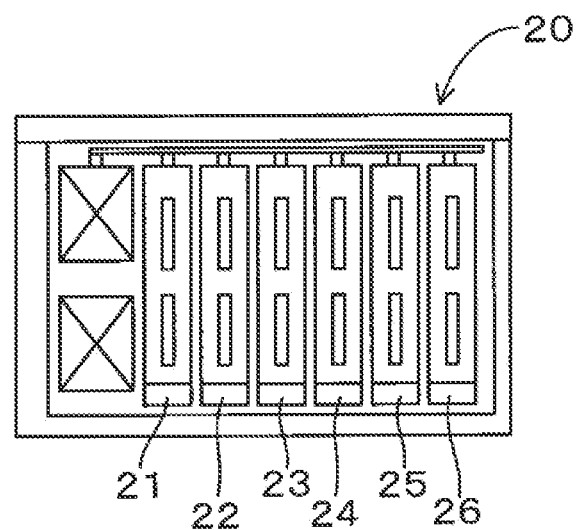
FIG. 4 is a conceptual cross-sectional view showing a configuration of an assembled battery according to the first embodiment.

The secondary battery 2 targeted for assessment of the degree of degradation to be conducted by the degradation degree assessment device 1 shown in FIG. 1 is not limited to any specific type, and may be a known secondary battery such as a nickel-metal hydride battery or a lithium-ion secondary battery. The secondary battery 2 targeted for assessment may be a cell being a single battery or an assembled battery made by combining a plurality of single batteries. In addition, the secondary battery 2 targeted for assessment may be a secondary battery module that includes one or more cells, each of which is a secondary battery or the like forming a minimum unit. The secondary battery module can include two cells, three cells, four cells, six cells, or the like. As shown in FIG. 4, the secondary battery module may be a plurality of secondary battery modules 21 to 26 included in the assembled battery 20. For example, the assembled battery 20 that has been spent can be disassembled, the plurality of secondary battery modules 21 to 26 is taken out therefrom, and the degrees of degradation of the secondary battery modules 21 to 26 can be assessed by the degradation degree assessment device 1. Then, on the basis of a result of the assessment, the plurality of secondary battery modules 21 to 26 can be screened.

As shown in FIG. 1, the degradation degree assessment device 1 includes a detection unit 3, a storage unit 4, a memory unit 5, a computation unit 6, and a control unit 7.

The control unit 7 includes a charge/discharge control unit 71 that controls charge/discharge of the secondary battery 2. Note that the charge/discharge of the secondary battery 2 controlled by the charge/discharge control unit 71 includes any of the following cases: charge only, discharge only, discharge followed by charge, and charge followed by discharge.

The detection unit 3 includes a voltage value detection unit 31 and a current value detection unit 32. The voltage value detection unit 31, which includes a predetermined voltmeter, is connected to the secondary battery 2 to detect a value of the voltage in the secondary battery 2. The current value detection unit 32, which includes a predetermined ammeter, is connected to the secondary battery 2 to acquire a value of the current that has flowed through the secondary battery 2. Note that the configuration is provided such that the open circuit voltage of the secondary battery 2 is acquired on the basis of the voltage value detected by the voltage value detection unit 31.

The storage unit 4 shown in FIG. 1 is formed of a rewritable nonvolatile memory and includes a voltage value storage unit 41 and a current value storage unit 42. The voltage value storage unit 41 stores a voltage value detected by the voltage value detection unit 31, and the current value storage unit 42 stores a current value detected by the current value detection unit 32.

The memory unit 5 shown in FIG. 1 is formed of a nonvolatile memory and includes a correspondence relationship memory unit 51 and a reference value memory unit 52. In the present embodiment, the correspondence relationship memory unit 51 stores the correspondence relationship between a battery characteristic and a total capacity. The correspondence relationship is not limited to any specific form, and may be in the form of, for example, a computation formula, a map, a graph, a table, or the like. The correspondence relationship can be created by machine learning through the use of the secondary battery 2 for measurement, created on the basis of an actual measurement value obtained by conducting an accelerated degradation test through the use of the secondary battery 2 for measurement, or created by a computation formula that logically derives the correspondence relationship between a battery characteristic and a total capacity in a predetermined voltage section through the use of a model of the secondary battery 2. Note that the correspondence relationship stored in the correspondence relationship memory unit 51 is set as appropriate on the basis of battery characteristics acquired by the battery characteristic acquisition unit 61, which will be described later.

The total capacity can be a capacity during charge from the fully discharged state to the fully charged state. Alternatively, the total capacity can be a capacity during discharge from the fully charged state to the fully discharged state. Here, the fully discharged state may be an effective fully discharged state defined for a system such as a vehicle in which the secondary battery 2 is mounted, or may be a state in which a lower limit voltage specified by a user who uses the degradation degree assessment device 1 is reached. The fully charged state may be an effective fully charged state defined for the above-mentioned system such as a vehicle, or may be a state in which an upper limit voltage specified by the above-mentioned user is reached.

The reference value memory unit 52 shown in FIG. 1 stores in advance a reference value to be used by the assessment unit 63, which will be described later, for assessing the degree of degradation. The reference value is set as appropriate in accordance with the mode of assessment to be made by the assessment unit 63. In the present embodiment, a plurality of reference values are set so that the degree of degradation can be assessed on a scale of 1 to 5.

The computation unit 6 shown in FIG. 1 is formed of a predetermined computation device and includes a battery characteristic acquisition unit 61, a capacity estimation unit 62 as an estimation unit, and an assessment unit 63. The battery characteristic acquisition unit 61 acquires a battery characteristic of the secondary battery 2. The battery characteristic of the secondary battery 2 may be, for example, a characteristic based on a voltage transition or temperature transition of the secondary battery 2 in a predetermined voltage section Vs. Note that the battery characteristic acquisition unit 61 may acquire, as a battery characteristic, the absolute value of an acquired value.

Figure 2:
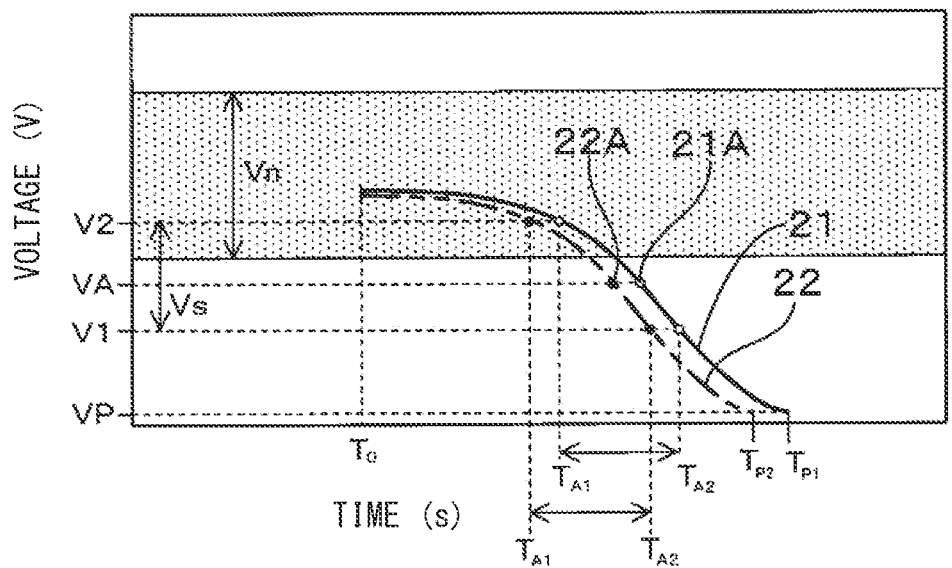
FIG. 2 is a conceptual diagram showing battery characteristics according to the first embodiment.

In the present embodiment, a discharge voltage characteristic is used as the battery characteristic. As shown in FIG. 2, the discharge voltage characteristic is computed on the basis of the voltage transition during discharge of the secondary battery 2 up to the discharge target voltage VP. The discharge target voltage VP is not limited to any specific voltage, and may be a voltage equal to or lower than the lower limit value of voltage values of the secondary battery 2 in a normal use range Vn. The voltage transition can be computed on the basis of, for example, at least one of: a section capacity of the secondary battery 2 in the predetermined voltage section Vs; a rate of the voltage change of the secondary battery 2 with respect to the capacity change of the secondary battery 2 in the predetermined voltage section Vs; and a rate of the voltage change of the secondary battery 2 with respect to the elapsed time in the predetermined voltage section Vs.

The predetermined voltage section Vs may be a voltage section that exhibits a correlation between the degree of degradation of the secondary battery 2 and the battery state transition. The voltage section Vs can be set on the basis of the type or configuration of the secondary battery 2, or can be derived by machine learning through the use of the secondary battery 2. For example, as shown in FIG. 2, the predetermined voltage section Vs in the present embodiment is a section between voltage values V1 and V2. The voltage section Vs is a section in which discharge voltage characteristics significantly vary depending on the degree of degradation of the secondary battery 2.

In the first embodiment, the capacity estimation unit 62 shown in FIG. 1 estimates the total capacity of the secondary battery 2 on the basis of the battery characteristic acquired by the battery characteristic acquisition unit 61. For estimation of the total capacity, a prediction model such as a regression formula can be used. For example, linear regression, LASSO regression, Ridge regression, a decision tree, support vector regression, or the like can be used.

The assessment unit 63 shown in FIG. 1 assesses the degree of degradation of the secondary battery 2 on the basis of a battery characteristic or a battery characteristic-related value. The battery characteristic-related value is a value computed on the basis of a battery characteristic. In the first embodiment, a result of estimation by the capacity estimation unit 62 is employed as the battery characteristic-related value. Accordingly, in the first embodiment, the assessment unit 63 assesses the degree of degradation of the secondary battery 2 on the basis of a result of estimation by the capacity estimation unit 62. An assessment method may include comparing a result of estimation by the capacity estimation unit 62 with reference values stored in advance in the reference value memory unit 52.

The following describes a method of assessing the degree of degradation conducted by the degradation degree assessment device 1 of the present embodiment.

Figure 3:
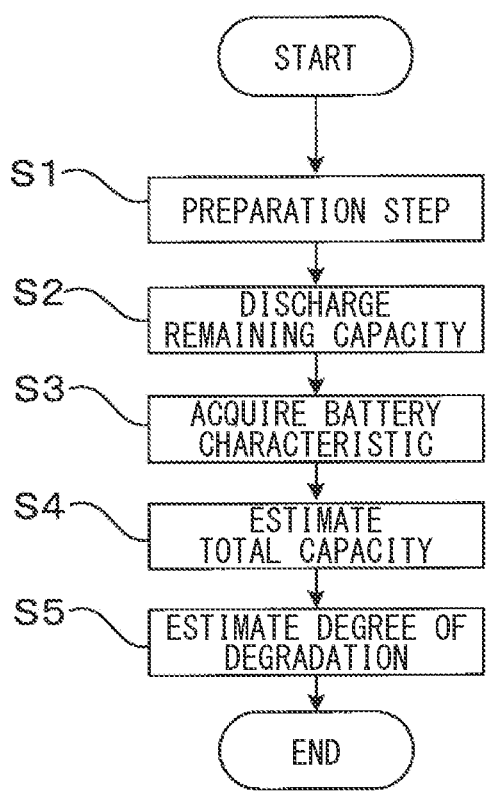
FIG. 3 is a flowchart showing a method of assessing the degree of degradation of a secondary battery according to the first embodiment.

In the first place, in the present embodiment, first, as a preparation step in step S1 shown in FIG. 3, secondary battery modules 21 to 26 are taken out from the spent assembled battery 20 shown in FIG. 4.

Next, in step S2 shown in FIG. 3, each of the secondary battery modules 21 to 26 is discharged until the open circuit voltage reaches the discharge target voltage VP. As a result, the remaining capacity of each of the secondary battery modules 21 to 26 is discharged. In a case where the secondary battery modules 21 to 26 are nickel-metal hydride batteries, the memory effect is canceled together with the discharge of the remaining capacity.

In addition to the discharge of the remaining capacity in step S2, in step S3 shown in FIG. 3, the battery characteristic acquisition unit 61 acquires battery characteristics of the individual secondary battery modules 21 to 26. In the present embodiment, the above-described discharge voltage characteristics are acquired as battery characteristics. As described above, the discharge voltage characteristic is based on the voltage transition in the predetermined voltage section Vs of each of the secondary battery modules 21 to 26 shown in FIG. 2.

In the present embodiment, as shown in FIG. 2, the battery characteristic acquisition unit 61 acquires, as the voltage transition of the first secondary battery module 21, a voltage temporal change indicating the relationship between a voltage change and a lapse of time from discharge start $T_0$ to discharge end $T_{P1}$. Then, a differential value at the voltage VA in the predetermined voltage section Vs, that is, the slope of a tangent line at the voltage VA indicated by a reference sign 21A in the graph of a voltage temporal change shown in FIG. 2, is computed. The differential value is used as a discharge voltage characteristic of the first secondary battery module 21. In addition, as shown in FIG. 2, a voltage temporal change of the second secondary battery module 22 is acquired as the voltage transition, a differential value at the voltage VA indicated by a reference sign 22A in the predetermined voltage section Vs is computed, and the differential value is used as a discharge voltage characteristic of the second secondary battery module 22. Likewise, for each of the third to sixth secondary battery modules 23 to 26, a voltage temporal change is acquired as the voltage transition, a differential value at the voltage VA is computed, and the differential value is used as a discharge voltage characteristic.

In the present embodiment, a voltage temporal change is acquired as the voltage transition, and the differential value at the voltage VA in the predetermined voltage section Vs is used as a discharge voltage characteristic. Alternatively, the rate of voltage change between two points in the voltage temporal change derived as the voltage transition, that is, the slope of a straight line passing through the two points in a graph of the voltage temporal change, may be computed and used as a discharge voltage characteristic. For example, as the two points in the voltage temporal change of the first secondary battery module 21 shown in FIG. 2, start time $T_{A1}$ and end time $T_{A2}$ of the voltage section Vs may be employed, and similarly, two points may be employed for each of the other secondary battery modules 22 to 26.

In addition, in the present embodiment, a voltage temporal change is acquired as a voltage transition and a differential value at the voltage VA in the predetermined voltage section Vs is used as a discharge voltage characteristic. Alternatively, as the voltage transition, a voltage-capacity change indicating the relationship between capacities from a capacity $Q_0$ at discharge start to a capacity $Q_{P1}$ at discharge end and a voltage change may be acquired. Then, the differential value at the voltage VA in the predetermined voltage section Vs, that is, the slope of a tangent line at the voltage VA in the graph of a voltage-capacity change, may be computed, and the differential value may be used as a discharge voltage characteristic of the first secondary battery module 21.

Next, in step S4 shown in FIG. 3, the capacity estimation unit 62 estimates the total capacity, that is, the full charge capacity or the full discharge capacity, of each of the secondary battery modules 21 to 26 on the basis of the battery characteristics acquired by the battery characteristic acquisition unit 61. In the present embodiment, the capacity estimation unit 62 estimates the total capacity of each of the secondary battery modules 21 to 26 from the discharge voltage characteristics acquired by the battery characteristic acquisition unit 61 as battery characteristics, on the basis of the correspondence relationship between a discharge voltage characteristic and a total capacity, the correspondence relationship being based on a prediction model and stored in the correspondence relationship memory unit 51.

In step S5 shown in FIG. 3, the assessment unit 63 assesses the degree of degradation of each of the secondary battery modules 21 to 26 on the basis of the total capacities estimated by the capacity estimation unit 62.

The following describes a method of producing a rebuilt product by assembling the secondary battery modules 2 taken out from the spent assembled battery 20 into a new assembled battery 20.

Figure 5:
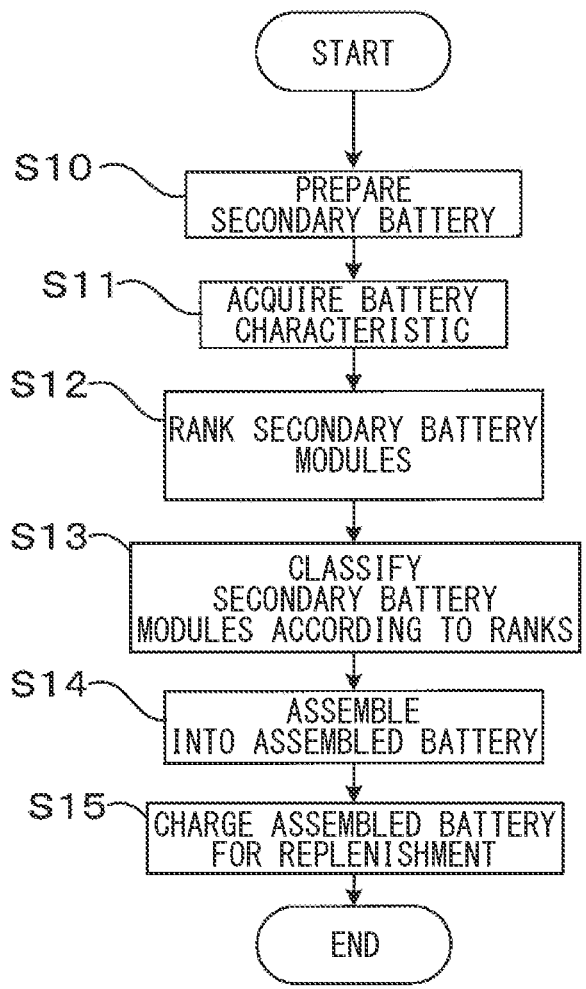
FIG. 5 is a flowchart showing a method of producing an assembled battery according to the first embodiment.

First, in step S10 shown in FIG. 5, a plurality of secondary battery modules 2 taken out from the assembled battery 20 is prepared. In step S11, the battery characteristic of each of the secondary battery modules 2 is acquired. The battery characteristics can be acquired in a manner similar to the manner in the case of acquiring battery characteristics in the degradation degree assessment device 1 according to the first embodiment. Then, in step S12, the secondary battery module 2 is ranked on the basis of the battery characteristic or of a battery characteristic-related value computed on the basis of the battery characteristic. In the present embodiment, as the battery characteristic-related value, the total capacity of the secondary battery module 2 is estimated on the basis of the battery characteristic, and the secondary battery module 2 is ranked on the basis of whether the absolute value of the degree of degradations of the secondary battery module 2 as computed from the total capacity is within a predetermined range. In the present embodiment, absolute values of the degrees of degradation are divided on a scale of 1 to 5, and are given rank A, rank B, rank C, rank D, and rank E from lower to higher absolute values of the degrees of degradation. Note that any standard for the ranking may be set as appropriate.

Next, in step S13 shown in FIG. 5, the secondary battery modules 2 are screened on the basis of the ranks. In the present embodiment, the secondary battery modules are divided in accordance with the ranks. As a result, the secondary battery modules 2 included in the same rank have similar degrees of degradation. In step S14, the secondary battery modules 2 of the same rank are combined and assembled into the assembled battery 20, thereby creating a rebuilt product. As a result, the secondary battery modules 2 included in the rebuilt assembled battery 20 have similar absolute value of the degrees of degradation, and thus the difference among the degrees of degradation can be made equal to or less than a predetermined reference value. Note that the reference value for a difference among degrees of degradation can be set as appropriate in accordance with the standard for the ranking. In the present embodiment, the secondary battery modules 2 of the same rank are used to create the assembled battery 20. However, this is not restrictive and the assembled battery 20 may be created within a predetermined range of ranks. For example, the assembled battery 20 may be made of the secondary battery modules 2 each included in rank A or rank B. Any secondary battery module 2 given the lowest rank, or rank E, may be regarded as unusable and discarded, or may be disassembled for recycling members thereof.

Thereafter, in the present embodiment, the assembled battery 20 as a unit is charged for replenishment in step S15 shown in FIG. 5. As a result, the secondary battery modules 2 can be used as the assembled battery 20.

The following describes operation and effects of the degradation degree assessment device 1 of the present embodiment in detail.

The degradation degree assessment device 1 of the present embodiment assesses the degree of degradation of the secondary battery module 2 on the basis of a battery characteristic or a battery characteristic-related value computed on the basis of the battery characteristic, the battery characteristic relating to the voltage transition in a predetermined voltage section Vs as acquired from the secondary battery module 2. Therefore, the degree of degradation can be assessed in a simple process. Furthermore, as the voltage section Vs from which a battery characteristic of the secondary battery module 2 is to be acquired, a voltage section Vs that exhibits a high correlation between the voltage transition and the degree of degradation of the secondary battery module 2 is set. Therefore, the degree of degradation of the secondary battery module 2 can be assessed with high accuracy.

With the degradation degree assessment device 1 of the present embodiment, it is possible to provide an assembled battery including a plurality of secondary battery modules 2 that include a recycled product, in which, in the plurality of secondary battery modules 2, a battery characteristic relating to transition of the battery state in a predetermined voltage section Vs of each of the secondary battery modules 2 or a battery characteristic-related value computed on the basis of the battery characteristic is within a predetermined range. With such assembled battery in the form of a rebuilt product, the assembled battery 20 that has small variations in battery characteristics can be provided. In addition, as the voltage section Vs from which a battery characteristic of the secondary battery module 2 is to be acquired, a voltage section Vs that exhibits a high correlation between the voltage transition and the degree of degradation of the secondary battery module 2 is set. Therefore, the secondary battery modules 2 included in the assembled battery 20 have small variations in the degree of degradation, with the result that the assembled battery 20 has a longer lifetime and better quality.

In the present embodiment, the capacity estimation unit 62 estimates the total capacity of the secondary battery module 2 from the battery characteristic acquired by the battery characteristics acquisition unit 61, and the assessment unit 63 assesses the degree of degradation of the secondary battery module 2 on the basis of a result of the estimation. Alternatively, the assessment unit 63 may assess the degree of degradation of the secondary battery module 2 on the basis of the battery characteristic acquired by the battery characteristic acquisition unit 61. Alternatively, the battery characteristic acquisition unit 61 may acquire the absolute value of an acquired value as the battery characteristic, and the assessment unit 63 may assess the degree of degradation on the basis of the absolute value. Alternatively, the assessment unit 63 may assess the degree of degradation of the secondary battery module 2 on the basis of a difference between battery characteristics acquired by the battery characteristic acquisition unit 61.

In the present embodiment, the secondary battery modules 2 are classified such that the degrees of degradation of the secondary battery modules 2 are within a predetermined range, and then the secondary battery modules 2 are assembled into the assembled battery 20. Alternatively, the secondary battery modules 2 may be classified such that a difference between degrees of degradation of the secondary battery modules 2 is within a predetermined range, and then the secondary battery modules 2 may be assembled into the assembled battery 20.

In the present embodiment, the battery characteristic is a discharge voltage characteristic based on the voltage transition up to a point where the secondary battery module 2 is discharged to a predetermined discharge target voltage VP. In cases where the secondary battery module 2 that has been spent is to be reused and the secondary battery module 2 is a nickel-metal hydride battery, the secondary battery module 2 may be discharged for the purpose of, for example, canceling the memory effect. In such cases, the work process for reusing the secondary battery module 2 can be simplified by acquiring the discharge voltage characteristic during the discharge.

Figure 6:
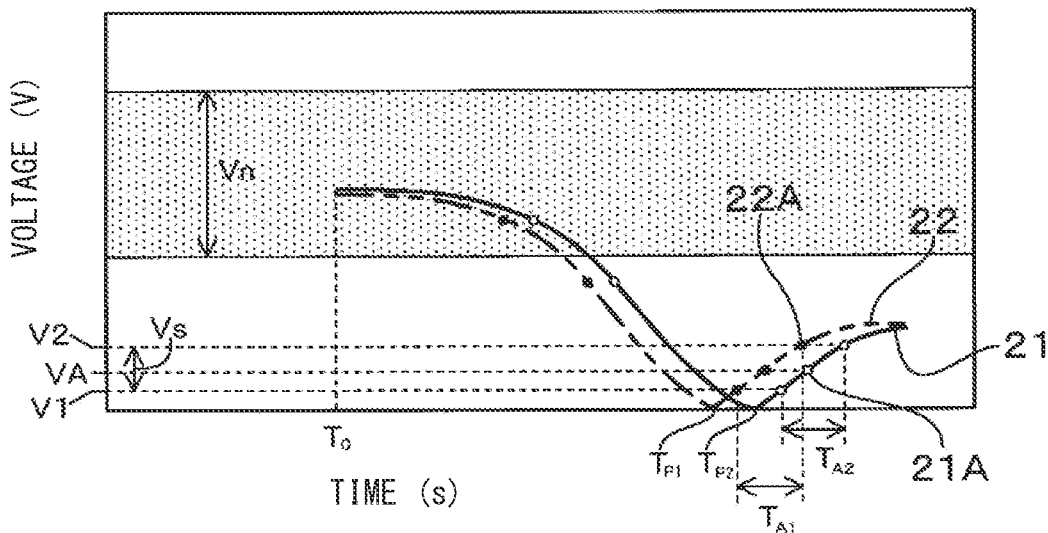
FIG. 6 is a conceptual diagram showing battery characteristics according to a first modification.

In the present embodiment, the discharge voltage characteristic is computed on the basis of the voltage transition during discharge of the secondary battery 2. Alternatively or additionally, the discharge voltage characteristic may be computed on the basis of the voltage transition during voltage relaxation in which the voltage of the secondary battery 2 returns to the open circuit voltage after the secondary battery is discharged to the discharge target voltage VP to stop being discharged. For example, as in a first modification shown in FIG. 6, for the first secondary battery module 21, a differential value at a predetermined voltage VA indicated by a reference sign 21A may be computed on the basis of the voltage transition in a predetermined voltage section Vs during voltage relaxation subsequent to time $T_{P1}$ when the battery module is discharged to the discharge target voltage VP to stop being discharged, and the differential value may be used as the discharge voltage characteristic. Likewise, for the second secondary battery module 22, a differential value at the predetermined voltage VA indicated by a reference sign 22A may be computed on the basis of the voltage transition in the predetermined voltage section Vs during voltage relaxation subsequent to time $T_{P2}$ when the discharge is stopped, and the differential value may be used as the discharge voltage characteristic. Likewise, for each of the other secondary battery modules 23 to 26 (not shown), a discharge voltage characteristic based on the voltage transition in the predetermined voltage section Vs during voltage relaxation can be acquired. In this case, operation and effects similar to those of the present embodiment are provided.

In the present embodiment, the capacity estimation unit 62 that estimates, as a battery characteristic-related value, the total capacity of the secondary battery by using the battery characteristic acquired by the battery characteristic acquisition unit 61 is included, and the assessment unit 63 assesses the degree of degradation of the secondary battery module 2 on the basis of a result of estimation by the capacity estimation unit 62. As a result, the degree of degradation of the secondary battery module 2 can be detected with high accuracy.

With the degradation degree assessment device 1 of the present embodiment, it is possible to provide the assembled battery 20 including a plurality of secondary battery modules 2 that include a recycled product, in which, in the plurality of secondary battery modules 2, a total capacity is estimated by using a battery characteristic including a discharge voltage characteristic based on at least one of: a voltage transition during discharge of each of the secondary battery modules 2 to a predetermined discharge target voltage VP; and a voltage transition after the secondary battery module 2 is discharged to the discharge target voltage VP and stops being discharged, and a difference between the individual degrees of degradation assessed on the basis of the total capacity is within a predetermined range. In the assembled battery 20, variations in the degree of degradation of the secondary battery modules 2 included in the assembled battery 20 are further reduced, and thus the assembled battery 20 as a rebuilt product has a longer lifetime and better quality.

In the present embodiment, as the voltage transition, the rate of the voltage change of the secondary battery module 2 with respect to the elapsed time in the predetermined voltage section Vs, that is, a differential value in a voltage temporal change, is computed, and the differential value is used as the discharge voltage characteristic. As a result, the degree of degradation of the secondary battery module 2 can be detected with ease and high accuracy.

Figure 7:
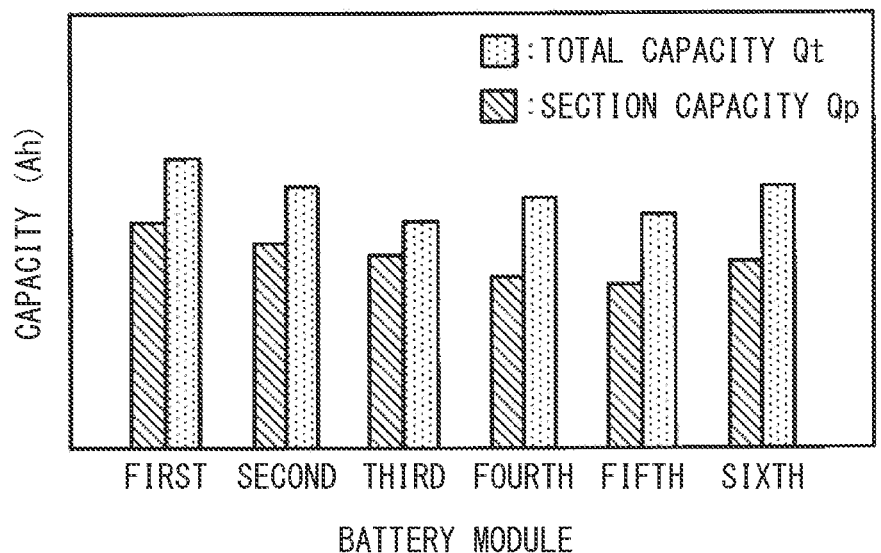
FIG. 7 is a conceptual diagram showing battery characteristics according to a second modification.

Instead of, or in addition to, computation of, as the voltage transition, the rate of the voltage change of the secondary battery module 2 with respect to the elapsed time in the predetermined voltage section Vs, the battery characteristic acquisition unit 61 may compute, as a section capacity Qp, the amount of capacity change of each of the secondary battery modules 21 to 26 in the predetermined voltage section Vs, as in a second modification shown in FIG. 7, and the section capacity may be used as a discharge voltage characteristic. The section capacity Qp can be computed from the value of the current flowing through each of the secondary battery modules 21 to 26 in the voltage section Vs as detected by the current value detection unit 32 and from the time period during which the current flows. In this case, the degree of degradation of the secondary battery module 2 can still be detected with ease and high accuracy on the basis of the discharge voltage characteristic.

Furthermore, as shown in FIG. 7, in addition to computing the capacity of each of the secondary battery modules 21 to 26 in a total section $T_0$ to $T_{P1}$, $T_0$ to $T_{P2}$ during discharge, that is, the total charge/discharge capacity Qt of the secondary battery module discharged to the discharge target voltage VP, the capacity ratio, which is the ratio of the section capacity Qp to the total charge/discharge capacity Qt as shown in Table 1 below, may be computed as the voltage transition, and the capacity ratio may be used as a discharge voltage characteristic. Alternatively, instead of the total charge/discharge capacity Qt, a specific section capacity Qt', which is the capacity in a specific voltage section including the voltage section Vs used for computing battery characteristics, may be computed, and the capacity ratio, which is the ratio of the section capacity Qp to the specific section capacity Qt', may be computed. This capacity ratio may be used as a discharge voltage characteristic. In these cases, the degree of degradation of the secondary battery module 2 can still be detected with ease and high accuracy on the basis of the discharge voltage characteristic.

TABLE 1

|  | First battery module 21 | Second battery module 22 | Third battery module 23 | Fourth battery module 24 | Fifth battery module 25 | Sixth battery module 26 |
| --- | --- | --- | --- | --- | --- | --- |
| Capacity ratio (Section capacity/Total charge/discharge capacity) | 0.778 | 0.784 | 0.856 | 0.690 | 0.703 | 0.717 |

Figure 8:
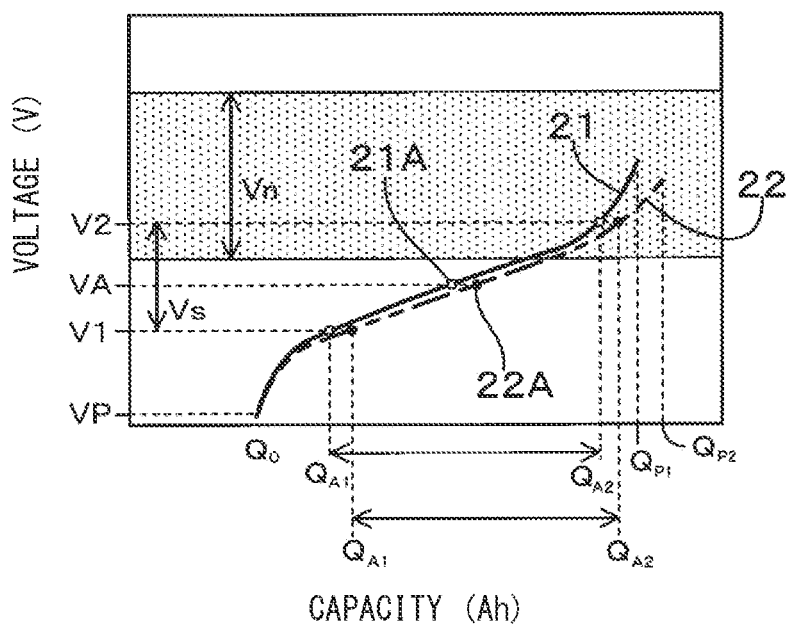
FIG. 8 is a conceptual diagram showing battery characteristics according to a third modification.

Furthermore, as in a third modification shown in FIG. 8, as the voltage transition, the rate of the voltage change of the secondary battery module 2 with respect to the capacity change in the predetermined voltage section Vs, that is, a differential value in a voltage capacity change at the predetermined voltage VA in the voltage section Vs, may be computed, and the differential value may be used as a discharge voltage characteristic. In this case, operation and effects similar to those of the present embodiment are provided.

With the degradation degree assessment device 1 of the present embodiment, it is possible to provide the assembled battery 20 including a plurality of secondary battery modules 2 that include a recycled product, in which, in the plurality of secondary battery modules 2, a total capacity is estimated by using a battery characteristic based on a voltage transition computed on the basis of at least one of: the amount of capacity change of each of the secondary battery modules 2 in a predetermined voltage section Vs; the rate of the voltage change of each of the secondary battery modules 2 with respect to the capacity change of the secondary battery module 2 in the predetermined voltage section Vs; and the rate of the voltage change of the secondary battery module 2 with respect to the elapsed time in the voltage section Vs, and a difference between the individual degrees of degradation assessed on the basis of the total capacity is within a predetermined range. In the assembled battery 20, variations in the degree of degradation of the secondary battery modules 2 included in the assembled battery 20 are further reduced, and thus the assembled battery 20 as a rebuilt product has better quality.

In the present embodiment, battery characteristics are computed and acquired by the battery characteristic acquisition unit 61 included in the degradation degree assessment device 1. Alternatively, the degradation degree assessment device 1 may include an external input unit, and battery characteristics may be computed by using an externally provided computation device and the battery characteristics may be input to the battery characteristic acquisition unit 61 via the external input unit, whereby the battery characteristic acquisition unit 61 acquires the battery characteristics.

As described above, according to the first embodiment and the first to third modifications, it is possible to provide the degradation degree assessment device 1 for a secondary battery capable of assessing the degree of degradation of a secondary battery with high accuracy in a simple configuration.

Second Embodiment

In the first embodiment described above, a discharge voltage characteristic is employed as the battery characteristic. In a second embodiment shown in FIG. 9, the battery characteristic includes, in addition to a discharge voltage characteristic, a charge voltage characteristic based on a voltage transition during charge until the secondary battery module 2 is charged to a predetermined charge target voltage VQ. The charge target voltage VQ is not particularly limited. In the present embodiment, the charge target voltage VQ is set to a value greater than the lower limit value and smaller than the upper limit value in a normal use range Vn. The other components are the same as those in the first embodiment, and the same reference numerals as those in the first embodiment are used for those components in the present embodiment and description thereof is omitted.

Figure 9:
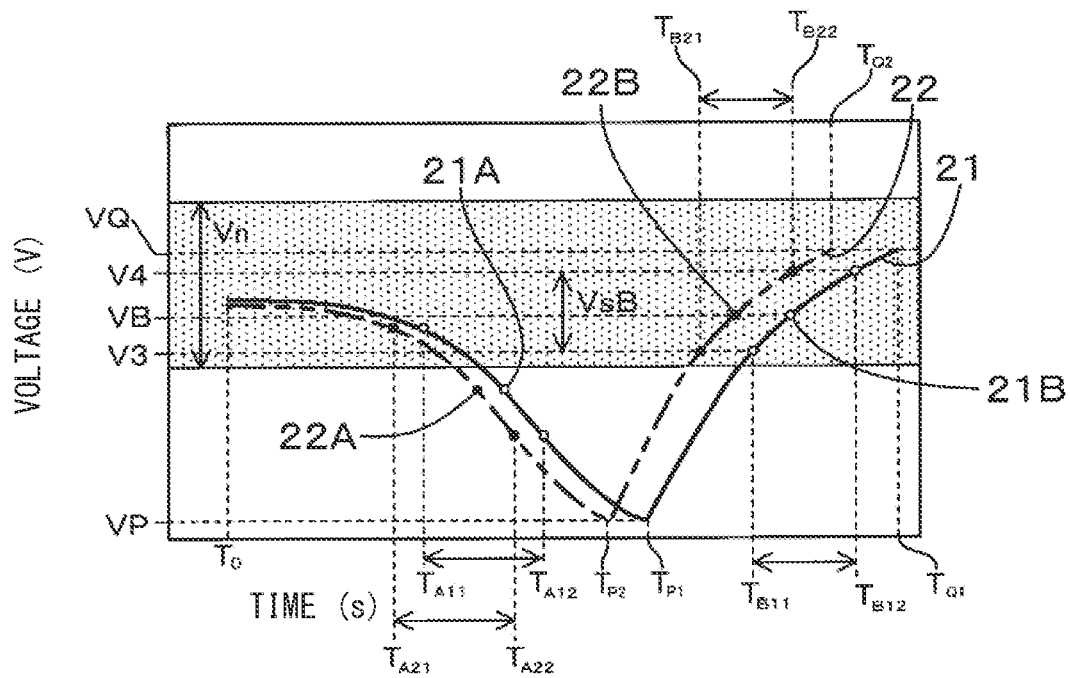
FIG. 9 is a conceptual diagram showing battery characteristics according to a second embodiment.

In the second embodiment, the voltage transition during charge can be computed in a similar manner to the manner of computation of the voltage transition for a discharge voltage characteristic in the first embodiment and the individual modifications, and the computed result is used as a charge voltage characteristic. Specifically, as shown in FIG. 9, as the voltage transition, a voltage temporal change indicating a relationship between a voltage change and a lapse of time from the charge start, which is the discharge end $T_{P1}$, $T_{P2}$, to the charge end $T_{Q1}$, $T_{Q2}$ is acquired. Then, a differential value at a voltage VB in a predetermined voltage section VsB, that is, the slope of a tangent line at the voltage VB indicated by a reference sign 21B in the graph of a voltage temporal change shown in FIG. 9, is computed. The differential value is used as a charge voltage characteristic of the first secondary battery module 21. In addition, as shown in FIG. 9, a voltage temporal change of the second secondary battery module 22 is acquired as the voltage transition, a differential value at the voltage VB indicated by a reference sign 22B in the predetermined voltage section VsB is computed, and the differential value is used as a charge voltage characteristic of the second secondary battery module 22. Likewise, for each of the third to sixth secondary battery modules 23 to 26, a voltage temporal change is acquired as the voltage transition, the differential value at the voltage VB is computed, and the differential value is used as a charge voltage characteristic. The predetermined voltage section VsB is set to a section between voltage values V3 and V4, in which difference in the charge voltage characteristics is significant depending on the degree of degradation of the secondary battery 2.

As in the case of computing a discharge voltage characteristic in the first embodiment described above, the charge voltage characteristic may be the rate of a voltage change between two points, which are the start time $T_{B11}$, $T_{B21}$ and the end time $T_{B12}$, $T_{B22}$, in the predetermined voltage section VsB, or the section capacity Qp in the voltage section VsB, or the capacity ratio of the section capacity Qp to a capacity in the whole section $T_{P1}$ to $T_{Q1}$, $T_{P2}$ to $T_{Q2}$ during charge, that is, a computed total charge/discharge capacity Qt in the case of charge to the charge target voltage VQ. Alternatively, instead of the total charge/discharge capacity Qt, a specific section capacity Qt', which is the capacity in a specific voltage section including the voltage section Vs used for computing battery characteristics, may be computed, and the capacity ratio, which is the ratio of the section capacity Qp to the specific section capacity Qt', may be computed. This capacity ratio may be used as a charge voltage characteristic. In addition, in the second embodiment, as the battery characteristic, a ratio between the section capacity for acquiring a discharge voltage characteristic and the section capacity for acquiring a charge voltage characteristic may be employed.

In the second embodiment, the battery characteristic acquisition unit 61 acquires both a discharge voltage characteristic and a charge voltage characteristic, and the capacity estimation unit 62 estimates the total capacity of the secondary battery 2 on the basis of these characteristics. As a result, the degree of degradation of the secondary battery 2 can be assessed more accurately.

In the case of producing the assembled battery 20 as a rebuilt product by using the degradation degree assessment device 1 of the second embodiment, the individual secondary battery modules 2 are charged before assembled into the assembled battery 20. Therefore, charging the assembled battery 20 for replenishment in step S15 in FIG. 5 is unnecessary.

In the second embodiment, the battery characteristic acquisition unit 61 acquires a discharge voltage characteristic and then acquires a charge voltage characteristic by discharging the secondary battery module 2 and then charging he secondary battery module 2, but this is not restrictive. Alternatively, the battery characteristic acquisition unit 61 may acquire a charge voltage characteristic and then acquire a discharge voltage characteristic by charging the secondary battery module 2 and then discharging the secondary battery module 2.

In the second embodiment, the battery characteristic acquisition unit 61 acquires both a discharge voltage characteristic and a charge voltage characteristic. Alternatively, a charge voltage characteristic may only be acquired. In this case, the assessment accuracy may be lower than in the case where both a discharge voltage characteristic and a charge voltage characteristic are acquired. On the other hand, in the case of acquiring a discharge voltage characteristic only, the assessment accuracy may be inhibited from being improved because of variations in the voltage transition under the influence of memory effect. In contrast, in the case of acquiring only the charge voltage characteristic that is acquired after the remaining capacity is discharged, the assessment accuracy is expected to be improved because the charge voltage characteristic is present after the memory effect is canceled, and thus is less affected by the memory effect.

Figure 10:
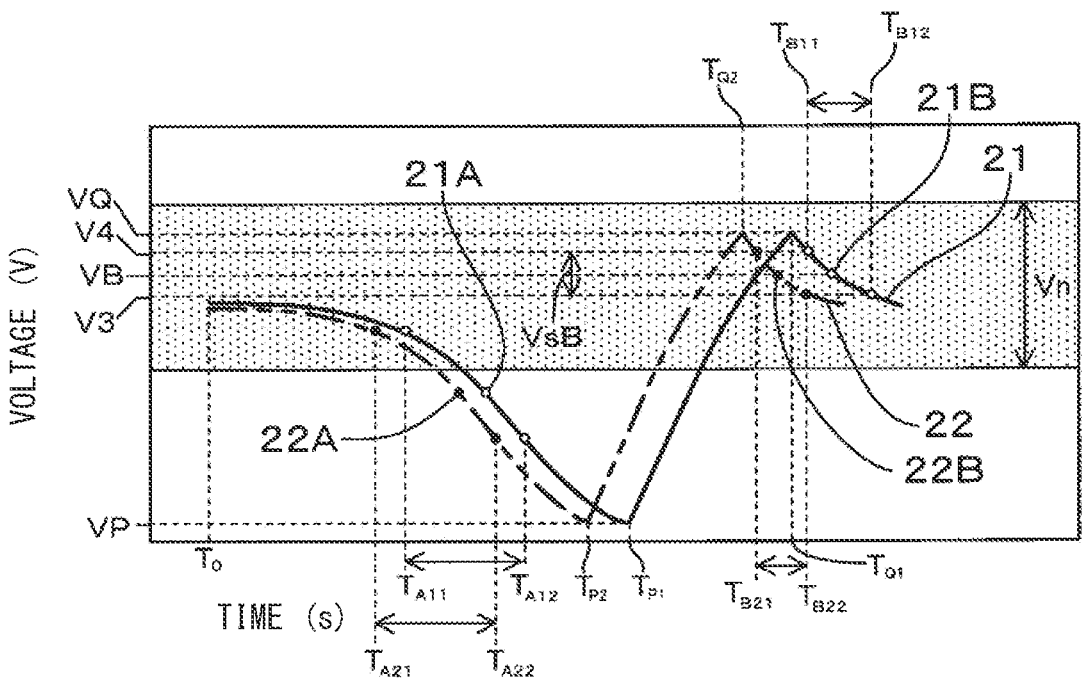
FIG. 10 is a conceptual diagram showing battery characteristics according to a fourth modification.

As in the case of computing a discharge voltage characteristic in the first embodiment, a charge voltage characteristic in the second embodiment may be computed on the basis of the voltage transition during voltage relaxation in which a battery module is charged to the predetermined charge target voltage VQ to stop being charged, and then the voltage returns to the open circuit voltage. For example, as in a fourth modification shown in FIG. 10, for the first secondary battery module 21, a differential value at a predetermined voltage VB indicated by a reference sign 21B may be computed on the basis of the voltage transition in a predetermined voltage section VsB during voltage relaxation subsequent to time $T_{Q1}$ when the battery module stops being charged, and the differential value may be used as the charge voltage characteristic. Likewise, for the second secondary battery module 22, a differential value at a predetermined voltage VB indicated by a reference sign 22B may be computed on the basis of the voltage transition in the predetermined voltage section VsB during voltage relaxation subsequent to time $T_{Q2}$ when the battery module stops being charged, and the differential value may be used as the charge voltage characteristic. In this case, operation and effects similar to those of the present embodiment are provided.

With the degradation degree assessment device 1 of the second embodiment, it is possible to provide the assembled battery 20 including a plurality of secondary battery modules 2 that include a recycled product, in which, in the plurality of secondary battery modules 2, a total capacity is estimated by using a battery characteristic including a charge voltage characteristic based on at least one of: a voltage transition caused by charge during charge of each of the secondary battery modules 2 to a predetermined charge target voltage VQ; and a voltage transition after the secondary battery module 2 is charged to the charge target voltage VQ and stops being charged, and a difference between the individual degrees of degradation assessed on the basis of the total capacity is within a predetermined range. In the assembled battery 20, variations in the degree of degradation of the secondary battery modules 2 included in the assembled battery 20 are further reduced, and thus the assembled battery 20 as a rebuilt product has a longer lifetime and better quality.

As in a modification of the first embodiment, in the second embodiment, the assessment unit 63 may assess the degree of degradation of the secondary battery module 2 on the basis of a battery characteristic acquired by the battery characteristic acquisition unit 61. Alternatively, the battery characteristic acquisition unit 61 may acquire the absolute value of an acquired value as the battery characteristic, and the assessment unit 63 may assess the degree of degradation on the basis of the absolute value. Alternatively, the assessment unit 63 may assess the degree of degradation of the secondary battery module 2 on the basis of a difference between battery characteristics acquired by the battery characteristic acquisition unit 61. In addition, the secondary battery modules 2 may be classified such that a difference between degrees of degradation of the secondary battery modules 2 is within a predetermined range, and then assembled into the assembled battery 20.

Third Embodiment

Figure 11:
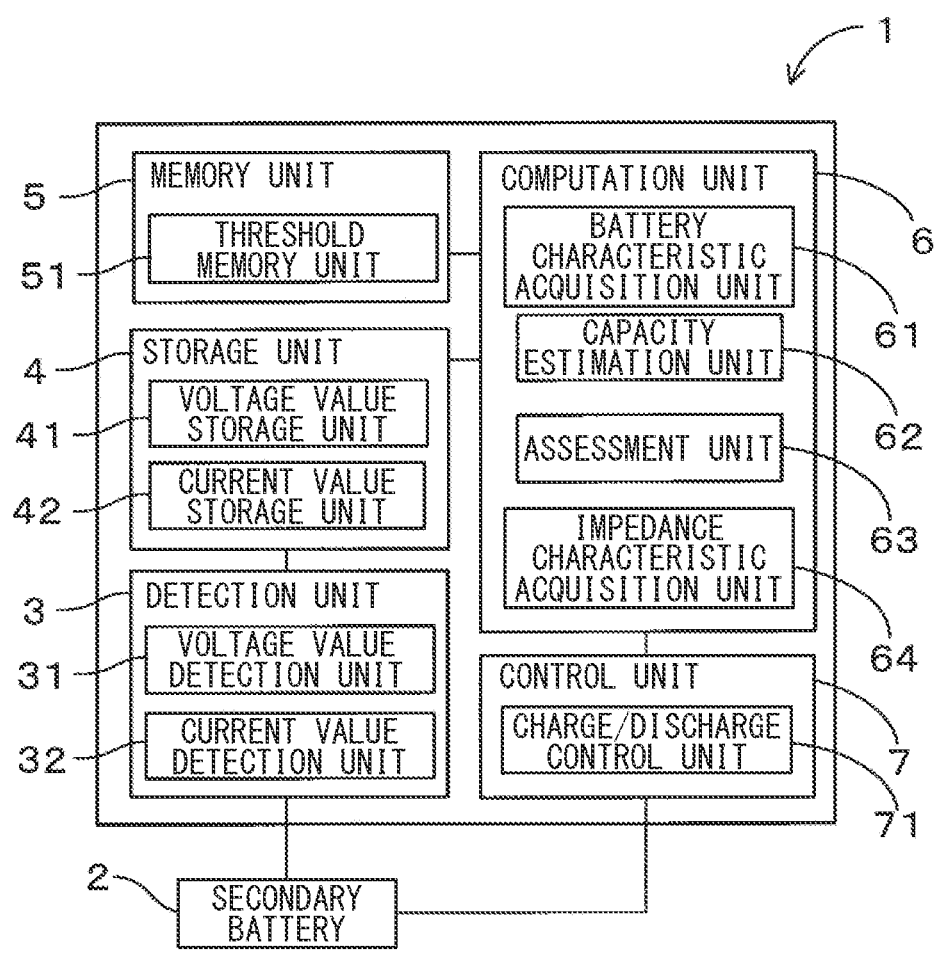
FIG. 11 is a conceptual diagram showing a configuration of a degradation degree assessment device according to a third embodiment.

In the degradation degree assessment device 1 of a third embodiment, as shown in FIG. 11, the computation unit 6 includes an impedance characteristic acquisition unit 64 in addition to the configuration of the first embodiment. The impedance characteristic acquisition unit 64, which has a configuration for measuring a complex impedance, is configured to be able to measure the impedance of the secondary battery 2. Other components are similar to those in the first embodiment and given the same reference signs as those in the first embodiment, and description thereof is omitted.

As in the first embodiment, in the third embodiment, the battery characteristic acquisition unit 61 acquires a discharge voltage characteristic in the predetermined voltage section Vs shown in FIG. 2. Then, the impedance characteristic acquisition unit 64 measures a complex impedance at the discharge end time $T_{P1}$, $T_{P2}$ shown in FIG. 2, acquires the impedance at a predetermined frequency, and computes values on the real axis and the imaginary axis on a complex plane.

Here, as the impedance characteristic, values on the real and imaginary axes for the impedance at a predetermined frequency f1, and the absolute value computed from the values on the real and imaginary axes can be used. In addition, an argument computed from the value on the real axis and the value on the imaginary axis at the predetermined frequency f1 can be used. Furthermore, it is also possible to use a difference between values on the real axis and a difference between values on the imaginary axis at predetermined frequencies f1 and f2, a difference between absolute values computed from the difference between the values on the real axis and the difference between the values on the imaginary axis, and an argument.

The correspondence relationship memory unit 51 stores a correspondence relationship between an impedance characteristic and a total capacity in advance. The correspondence relationship can be created by machine learning through the use of the secondary battery 2 for measurement, created on the basis of an actual measurement value obtained by conducting an accelerated degradation test through the use of the secondary battery 2 for measurement, or created by a computation formula that logically derives the correspondence relationship between an impedance characteristic at a predetermined voltage and a total capacity through the use of a model of the secondary battery 2.

In the third embodiment, the capacity estimation unit 62 shown in FIG. 11 estimates the total capacity of the secondary battery 2 on the basis of the discharge voltage characteristic acquired by the battery characteristic acquisition unit 61 and of the impedance characteristic acquired by the impedance characteristic acquisition unit 64. As in the first embodiment, the assessment unit 63 assesses the degree of degradation of the secondary battery 2 on the basis of a result of estimation by the capacity estimation unit 62. According to the third embodiment, the total capacity is estimated on the basis of a discharge voltage characteristic and an impedance characteristic, and thus the assessment accuracy can be further improved.

In the present embodiment, the impedance characteristic acquisition unit 64 measures a complex impedance at the discharge end time $T_{P1}$, $T_{P2}$. However, this is not restrictive, and the measurement may be made at another timing. For example, in the case where the battery characteristic acquisition unit 61 acquires a charge voltage characteristic as in the second embodiment, the impedance characteristic acquisition unit 64 may measure a complex impedance at the charge end time $T_{Q1}$, $T_{Q2}$ shown in FIG. 9. In addition, instead of an impedance characteristic, the capacity estimation unit 62 may use an impedance characteristic-related value computed on the basis of the impedance characteristic. As the impedance characteristic-related values, for example, a difference between impedance characteristics acquired by the impedance characteristic acquisition unit 64 can be employed.

With the degradation degree assessment device 1 of the third embodiment, it is possible to provide the assembled battery 20 including a plurality of secondary battery modules 2 that include a recycled product, in which, in the plurality of secondary battery modules 2, a difference between the individual degrees of degradation assessed on the basis of the total capacities estimated by using the battery characteristic and the impedance characteristic relating to an impedance present when each of the secondary battery modules 2 is discharged or charged is within a predetermined range. In the assembled battery 20, variations in the degree of degradation of the secondary battery modules 2 included in the assembled battery 20 are further reduced, and thus the assembled battery 20 as a rebuilt product has a longer lifetime and better quality.

As in a modification of the first embodiment, in the third embodiment, the assessment unit 63 may assess the degree of degradation of the secondary battery module 2 on the basis of a battery characteristic acquired by the battery characteristic acquisition unit 61 and of an impedance characteristic. Alternatively, the battery characteristic acquisition unit 61 may acquire the absolute value of an acquired value as the battery characteristic, and the assessment unit 63 may assess the degree of degradation on the basis of the absolute value. Alternatively, the assessment unit 63 may assess the degree of degradation of the secondary battery module 2 on the basis of a difference between battery characteristics acquired by the battery characteristic acquisition unit 61. In addition, the secondary battery modules 2 may be classified such that a difference between degrees of degradation of the secondary battery modules 2 is within a predetermined range, and then assembled into the assembled battery 20.

Fourth Embodiment

Figure 12:
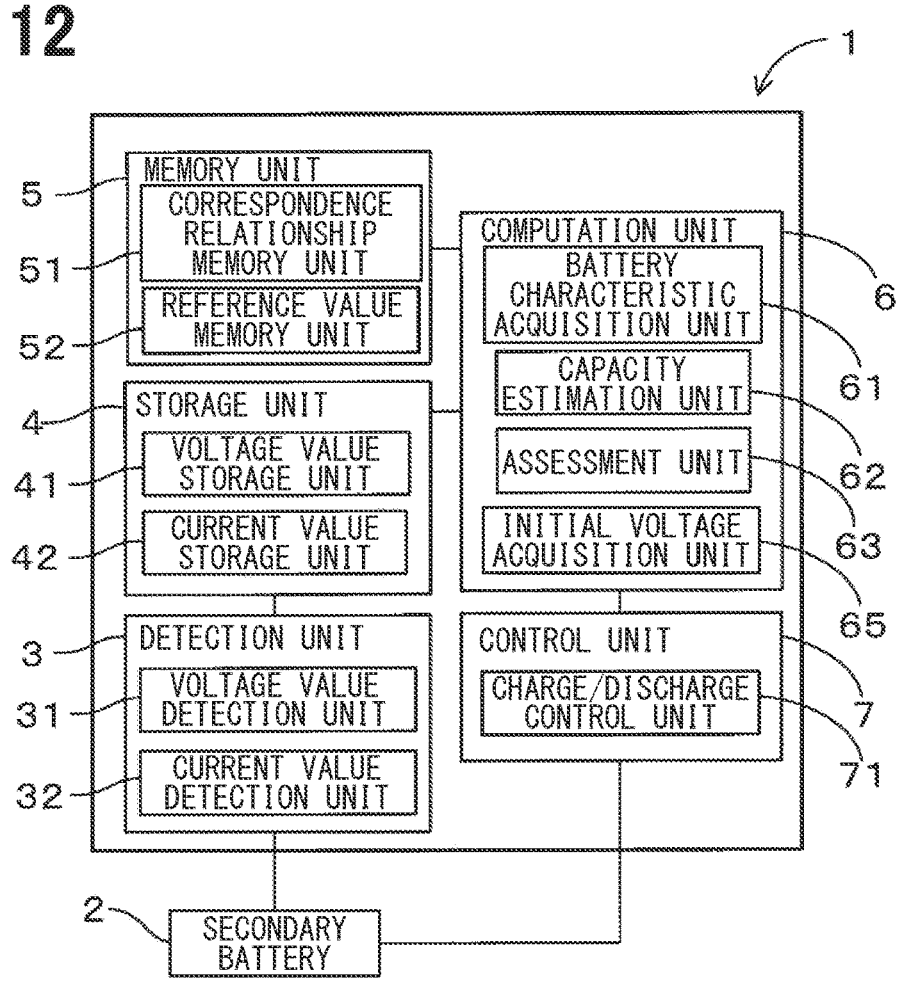
FIG. 12 is a conceptual diagram showing a configuration of a degradation degree assessment device according to a fourth embodiment.
Figure 13:
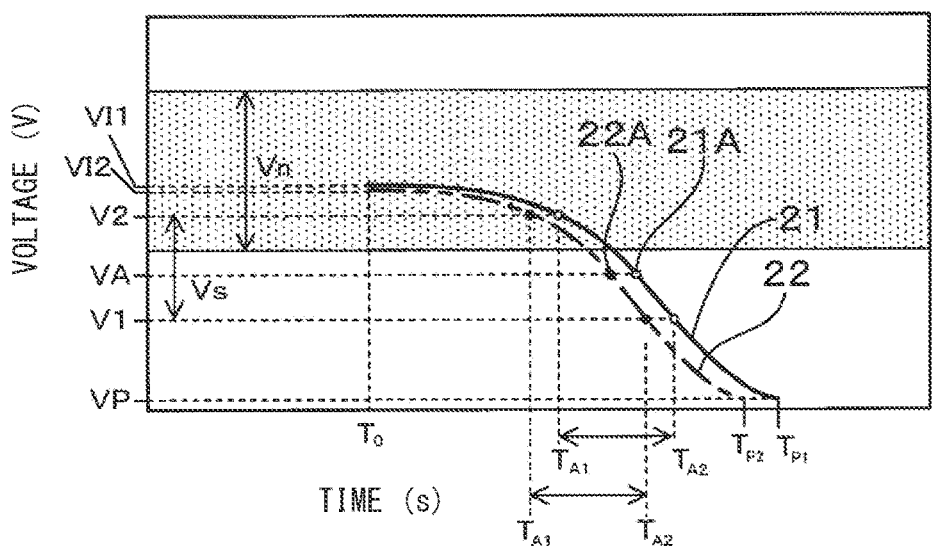
FIG. 13 is a conceptual diagram showing battery characteristics according to the fourth embodiment.

In a fourth embodiment, the configuration of the first embodiment further includes an initial voltage acquisition unit 65 as shown in FIG. 12. As shown in FIG. 13, the initial voltage acquisition unit 65 acquires an initial voltage VI1, VI2, which is the open circuit voltage of the secondary battery 2 at the discharge start time $T_0$. The correspondence relationship memory unit 51 stores a correspondence relationship among an initial voltage value, a battery characteristic, and a total capacity in advance. The correspondence relationship can be created in a manner similar to the manner in the first embodiment. Other components are similar to those in the first embodiment and given the same reference signs as those in the first embodiment, and description thereof is omitted.

With the degradation degree assessment device 1 of the fourth embodiment, the degree of degradation of the secondary battery 2 is assessed in consideration of the initial voltage in addition to the battery characteristic, and thus the assessment can be made with much higher accuracy in a simple configuration. Instead of the initial voltage, an initial voltage-related value computed on the basis of the initial voltage may be used. As the initial voltage-related value, for example, the absolute value of the initial voltage or a difference between initial voltages acquired by the initial voltage acquisition unit 65 can be used.

With the degradation degree assessment device 1 of the fourth embodiment, it is possible to provide the assembled battery 20 including a plurality of secondary battery modules 2 that include a recycled product, in which, in the plurality of secondary battery modules 2, a difference between the individual degrees of degradation assessed on the basis of the total capacities estimated by using the battery characteristic and the initial voltage, which is the open circuit voltage of each of the secondary battery modules 2 present when acquisition of a battery characteristic is started is within a predetermined range. In the assembled battery 20, variations in the degree of degradation of the secondary battery modules 2 included in the assembled battery 20 are further reduced, and thus the assembled battery 20 as a rebuilt product has a longer lifetime and better quality.

As in a modification of the first embodiment, in the fourth embodiment, the assessment unit 63 may assess the degree of degradation of the secondary battery module 2 on the basis of a battery characteristic acquired by the battery characteristic acquisition unit 61 and of an initial voltage. Alternatively, the battery characteristic acquisition unit 61 may acquire the absolute value of an acquired value as the battery characteristic, and the assessment unit 63 may assess the degree of degradation on the basis of the absolute value. Alternatively, the assessment unit 63 may assess the degree of degradation of the secondary battery module 2 on the basis of a difference between battery characteristics acquired by the battery characteristic acquisition unit 61. In addition, the secondary battery modules 2 may be classified such that a difference between degrees of degradation of the secondary battery modules 2 is within a predetermined range, and then assembled into the assembled battery 20.

Figure 14:
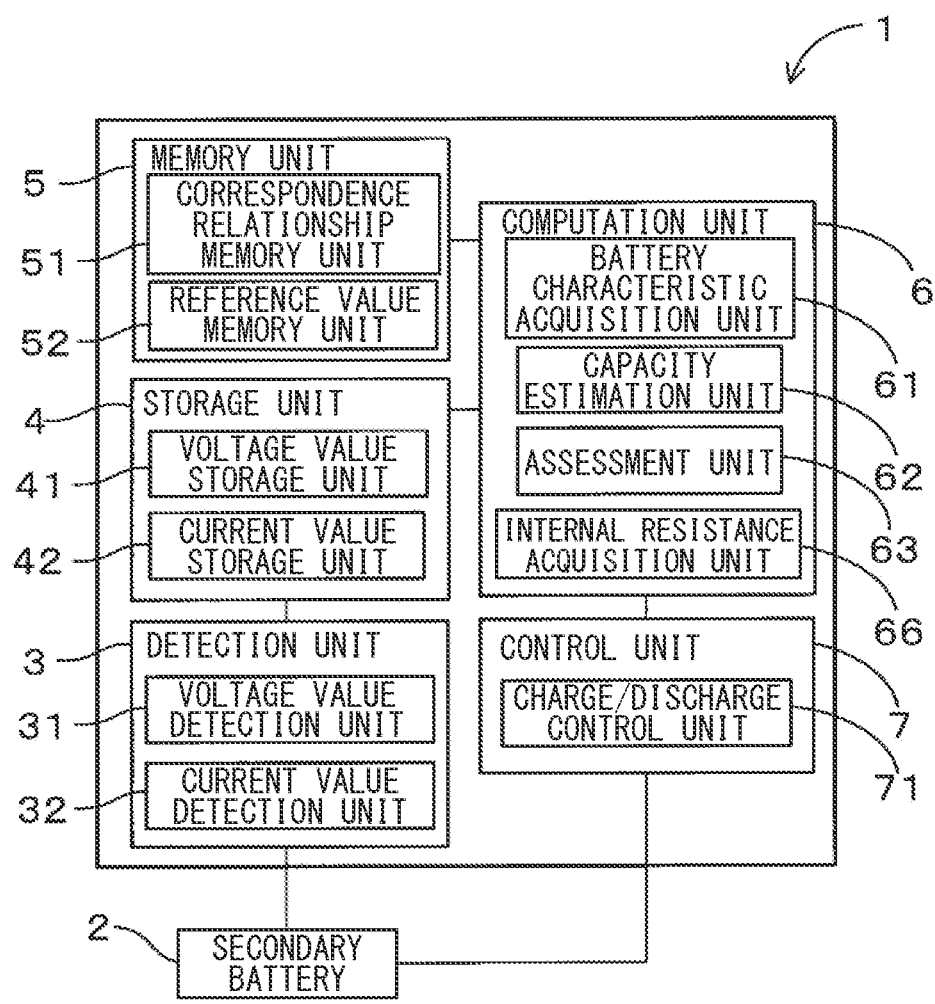
FIG. 14 is a conceptual diagram showing a configuration of a degradation degree assessment device according to a fifth modification.

As shown in FIG. 14 for a fifth modification, which is another modification, the computation unit 6 may include an internal resistance acquisition unit 66 that acquires an internal resistance of the secondary battery 21, and the correspondence relationship memory unit 51 may store a correspondence relationship among an internal resistance, a battery characteristic, and a total capacity in advance. The internal resistance acquisition unit 66 can compute and acquire the internal resistance from the measured voltage, which is the voltage value itself detected by the voltage value detection unit 31, the open circuit voltage of the secondary battery 2, and the current flowing through the secondary battery 2. The open circuit voltage of the secondary battery 2 can be estimated and acquired at each certain time by using a map that indicates a correspondence relationship between a remaining discharge capacity and an initial voltage of the secondary battery 2. With the degradation degree assessment device 1 of the fifth modification, the degree of degradation of the secondary battery 2 is assessed in consideration of the internal resistance in addition to the battery characteristic, and thus the assessment can be made with much higher accuracy in a simple configuration.

Fifth Embodiment

Figure 15:
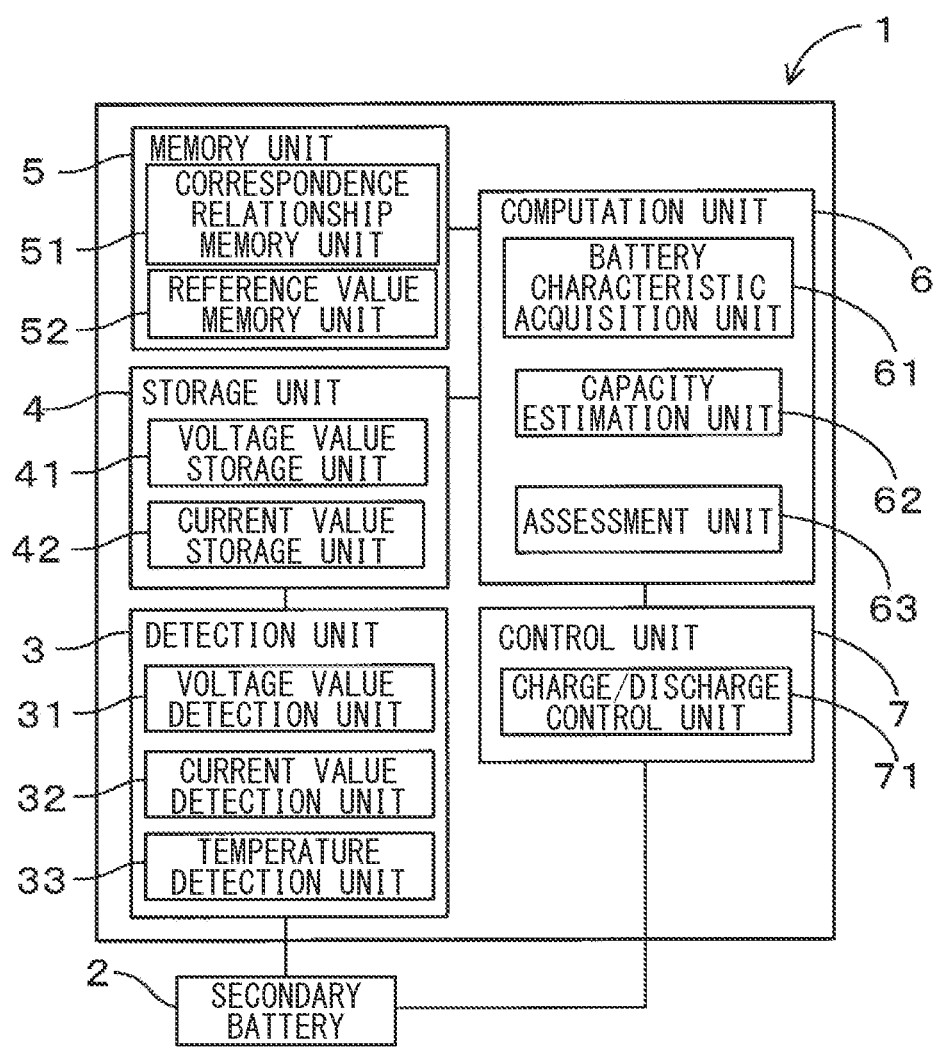
FIG. 15 is a conceptual diagram showing a configuration of a degradation degree assessment device according to a fifth embodiment.

As shown in FIG. 15, the degradation degree assessment device 1 of a fifth embodiment includes a temperature detection unit 33 in addition to the configuration of the first embodiment illustrated in FIG. 1. In the above-described first embodiment, the battery characteristic acquisition unit 61 is configured to acquire, as a battery characteristic, a discharge voltage characteristic based on the voltage transition of the secondary battery 2 in the predetermined voltage section Vs. In the fifth embodiment, instead of the discharge voltage characteristic, the battery characteristic acquisition unit 61 acquires, as a battery characteristic, a temperature characteristic based on the temperature transition of the secondary battery 2 in predetermined voltage sections VsA and VsB. Other components are similar to those in the first embodiment and given the same reference signs as those in the first embodiment, and description thereof is omitted. The predetermined voltage section VsA is a section in which difference in the discharge voltage characteristics is significant depending on the degree of degradation of the secondary battery 2, and the predetermined section VsB is a section in which difference in the charge voltage characteristics is significant depending on the degree of degradation of the secondary battery 2.

Figure 16:
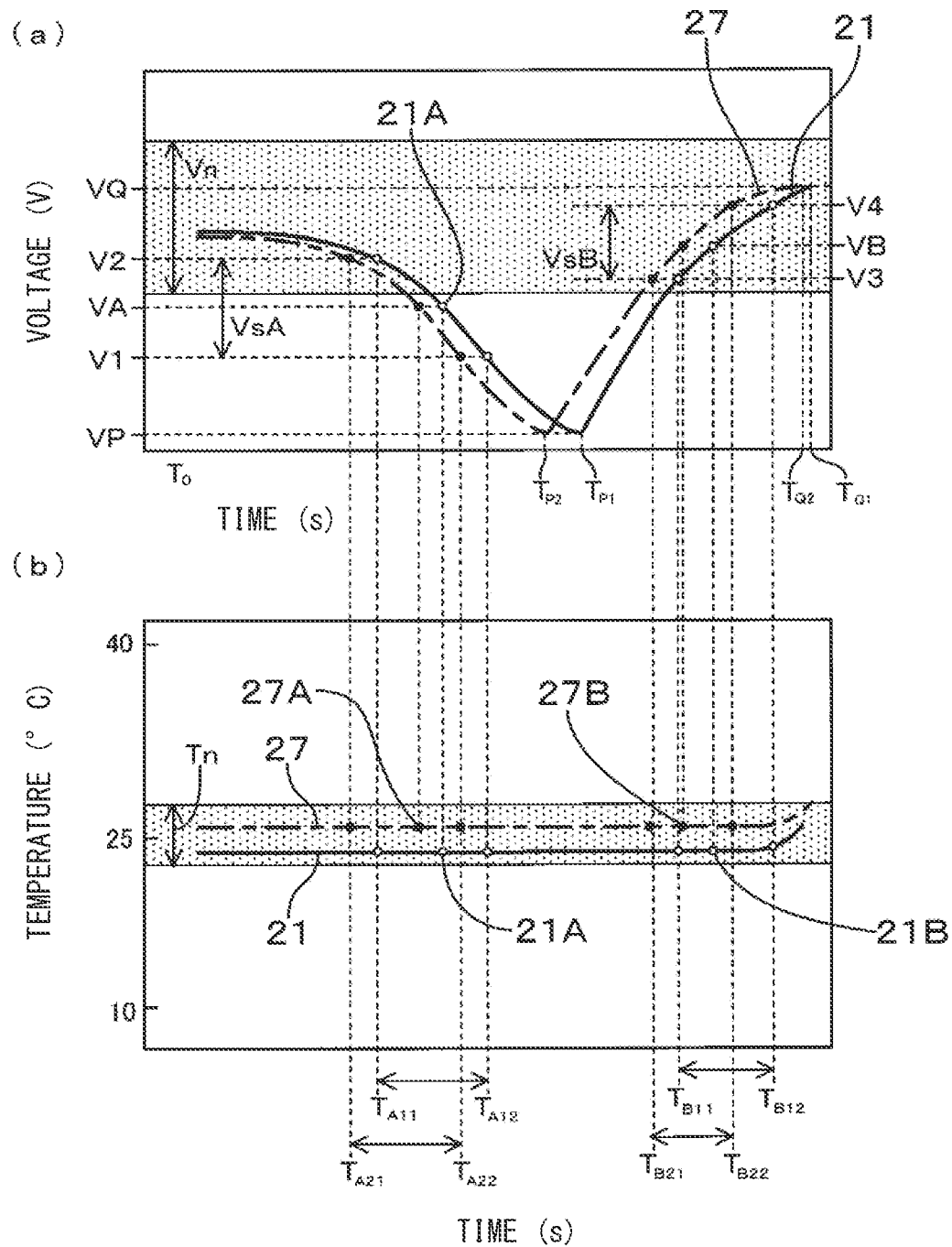
FIG. 16($a$) and FIG. 16($b$) are conceptual diagrams showing battery characteristics according to the fifth embodiment.

As shown in (a) and (b) in FIG. 16, in the fifth embodiment, the temperature of the secondary battery 2 being charged/discharged is acquired by the temperature detection unit 33. In the present embodiment, the first secondary battery module 21 taken out from the assembled battery 20 and a seventh secondary battery module 27 taken out from another assembled battery are employed as the secondary batteries 2 targeted for assessment of the degree of degradation.

In a case where the secondary battery modules are assembled into different assembled batteries, the secondary battery modules 2 being charged/discharged may exhibit different behaviors of temperature transition depending on the measurement environment or soak state of the secondary battery modules 2. In the present embodiment, as shown in (b) in FIG. 16, the first secondary battery module 21 and the seventh secondary battery module 27 exhibit temperature transitions that are both within a measured room temperature setting range Tn but are of slightly different behaviors. In the fifth embodiment, on the basis of the battery temperatures detected by the temperature detection unit 33 in both the predetermined voltage section VsA during discharge and the predetermined voltage section VsB during charge after the discharge, the battery characteristic acquisition unit 61 acquires a temperature characteristic during discharge and a temperature characteristic during charge. Then, the capacity estimation unit 62 estimates a total capacity of each of the secondary battery modules 21 and 27 on the basis of both the temperature characteristics, and the assessment unit 63 assesses the degree of degradation.

As in the case of computing a discharge voltage characteristic in the first embodiment and in the case of computing a charge voltage characteristic in the second embodiment, temperature characteristics acquired by the battery characteristic acquisition unit 61 may be differential values of temperature change at the predetermined voltages VA and VB in the predetermined voltage sections VsA and VsB, the rate of temperature change between two points in each of the predetermined voltage sections VsA and VsB, the rate of the temperature change of the secondary battery 2 with respect to the capacity change of the secondary battery 2 in each of the voltage sections VsA and VsB.

The fifth embodiment also provides operation and effects similar to those of the first embodiment. In the fifth embodiment, temperature characteristics are acquired during both discharge and charge. However, this is not restrictive and a temperature characteristic may be acquired during either discharge or charge only.

With the degradation degree assessment device 1 of the fifth embodiment, it is possible to provide the assembled battery 20 including a plurality of secondary battery modules 2 that include a recycled product, in which, in the plurality of secondary battery modules 2, a difference between the individual degrees of degradation assessed on the basis of the total capacities estimated by using the battery characteristic that includes a temperature characteristic based on the temperature transition of each of the secondary batteries in predetermined voltage sections VsA and VsB is within a predetermined range. In the assembled battery 20, variations in the degree of degradation of the secondary battery modules 2 included in the assembled battery 20 are further reduced, and thus the assembled battery 20 as a rebuilt product has better quality.

As in a modification of the first embodiment, in the fifth embodiment, the assessment unit 63 may assess the degree of degradation of the secondary battery module 2 on the basis of a temperature characteristic acquired by the battery characteristic acquisition unit 61. Alternatively, the battery characteristic acquisition unit 61 may acquire the absolute value of an acquired value as the temperature characteristic, and the assessment unit 63 may assess the degree of degradation on the basis of the absolute value. Alternatively, the assessment unit 63 may assess the degree of degradation of the secondary battery module 2 on the basis of a difference between temperature characteristics acquired by the battery characteristic acquisition unit 61. In addition, the secondary battery modules 2 may be classified such that a difference between degrees of degradation of the secondary battery modules 2 is within a predetermined range, and then assembled into the assembled battery 20.

Figure 17:
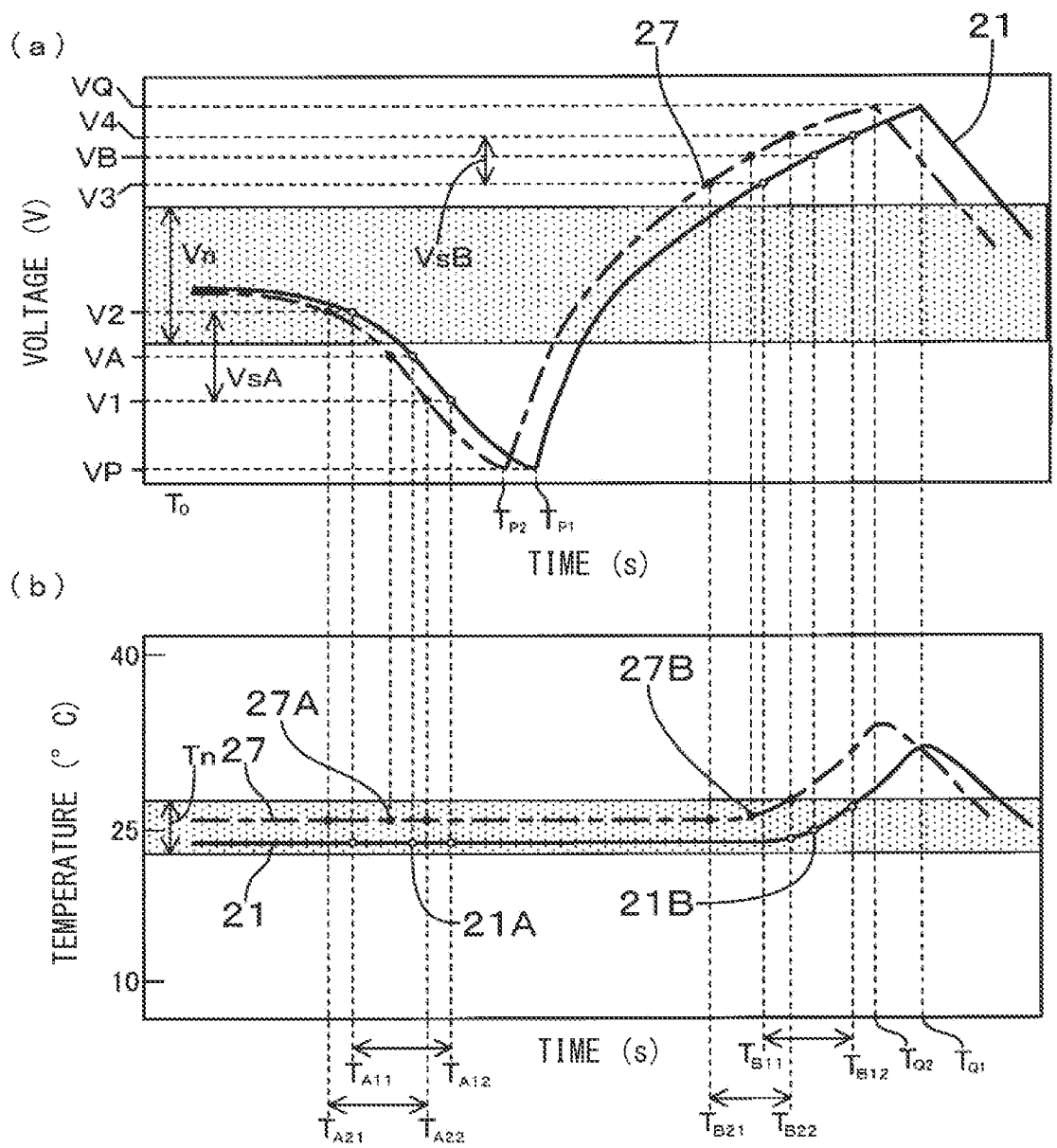
FIG. 17($a$) and FIG. 17($b$) are conceptual diagrams showing battery characteristics according to a sixth modification.

In the fifth embodiment, as shown in (a) in FIG. 16, as the temperature characteristic during charge, a temperature characteristic present when the charge target voltage VQ is within the normal use range Vn and the predetermined voltage section VsA is included in the normal use range Vn is acquired. Alternatively, as in a sixth modification shown in (a) in FIG. 17, as the temperature characteristic during charge, a temperature characteristic present when the charge target voltage VQ is outside the normal use range Vn and the predetermined voltage section VsB is outside the normal use range Vn may be acquired. In this case, the temperatures of the secondary battery modules 21 and 27 tend to rise as shown in (b) in FIG. 17, and thus the degree of degradation is more likely to be reflected in the temperature transition. As a result, the assessment accuracy can be improved. In the sixth modification, the secondary battery modules 21 and 27 are charged to the charge target voltage VQ and then discharged so that the voltages of the secondary battery modules 21 and 27 return into the normal use range Vn.

Figure 18:
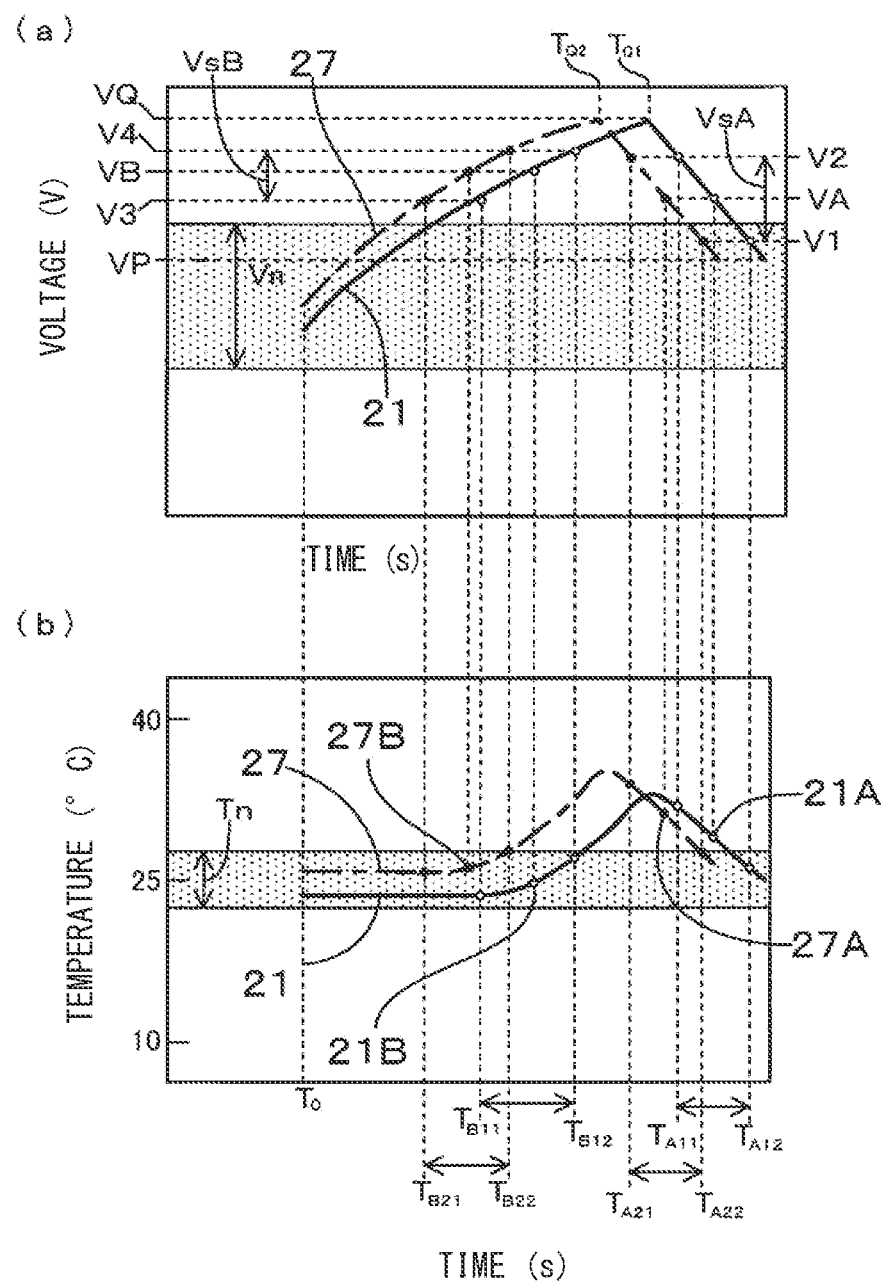
FIG. 18($a$) and FIG. 18($b$) are conceptual diagrams showing battery characteristics modification according to a seventh modification.

In the sixth modification, the secondary battery 2 is discharged, then charged, and then discharged again. Alternatively, as in a seventh modification shown in FIG. 18, the secondary battery 2 may be charged and then discharged without the first discharge. In this case, the battery characteristic acquisition unit 61 may acquire, during charge, a temperature characteristic during charge, and then acquire, during discharge, a temperature characteristic during discharge. In this case, operation and effects similar to those of the first embodiment are still provided.

Figure 19:
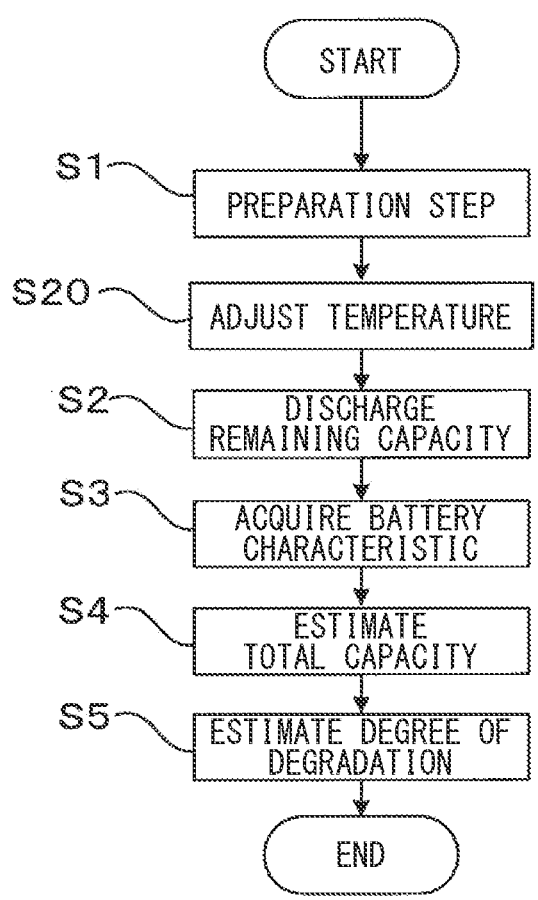
FIG. 19 is a flowchart showing a method of assessing the degree of degradation of a secondary battery according to an eighth modification.

As in an eighth modification shown in FIG. 19, in step S20 after the above-described preparation step S1, temperatures may be adjusted so that the secondary battery modules 21 to 26 are controlled to have a predetermined temperature. In a case where the secondary battery modules 21 to 26 are mounted on a vehicle, for the temperature adjustment, the temperature of a room in which the vehicle is contained can be controlled, or the temperature of the vehicle including the secondary battery modules 21 to 26 can be controlled by using a vehicle interior air conditioner mounted on the vehicle. By adjusting temperatures through such temperature adjustment and soaking the secondary batteries 21 to 26, the secondary battery modules 21 to 26 are allowed to have a preset temperature. A plurality of temperatures may be set as the preset temperature.

In the eighth modification, temperatures of the secondary battery modules 21 to 26 can be detected by a temperature sensor (not shown) provided in each of the secondary battery modules 21 to 26. In a case where a temperature sensor is not provided in each of the secondary battery modules 21 to 26 but provided in the assembled battery including the secondary battery modules 21 to 26, temperatures of the individual secondary battery modules 21 to 26 may be estimated in consideration of, for example, the arrangement of the secondary battery modules 21 to 26 in the assembled battery. The temperatures can be estimated by using an estimation formula for logically deriving the temperatures of the secondary battery modules, a map of detected temperatures and secondary battery temperatures created on the basis of a model of the assembled battery, or the like. After step S20 shown in FIG. 19, operations are performed as in S2 to S5 in FIG. 3. According to the assessment method, the secondary battery modules 21 to 26 are caused to have preset temperatures and then their degrees of degradation are assessed, and thus the assessment accuracy can be improved.

Sixth Embodiment

Figure 20:
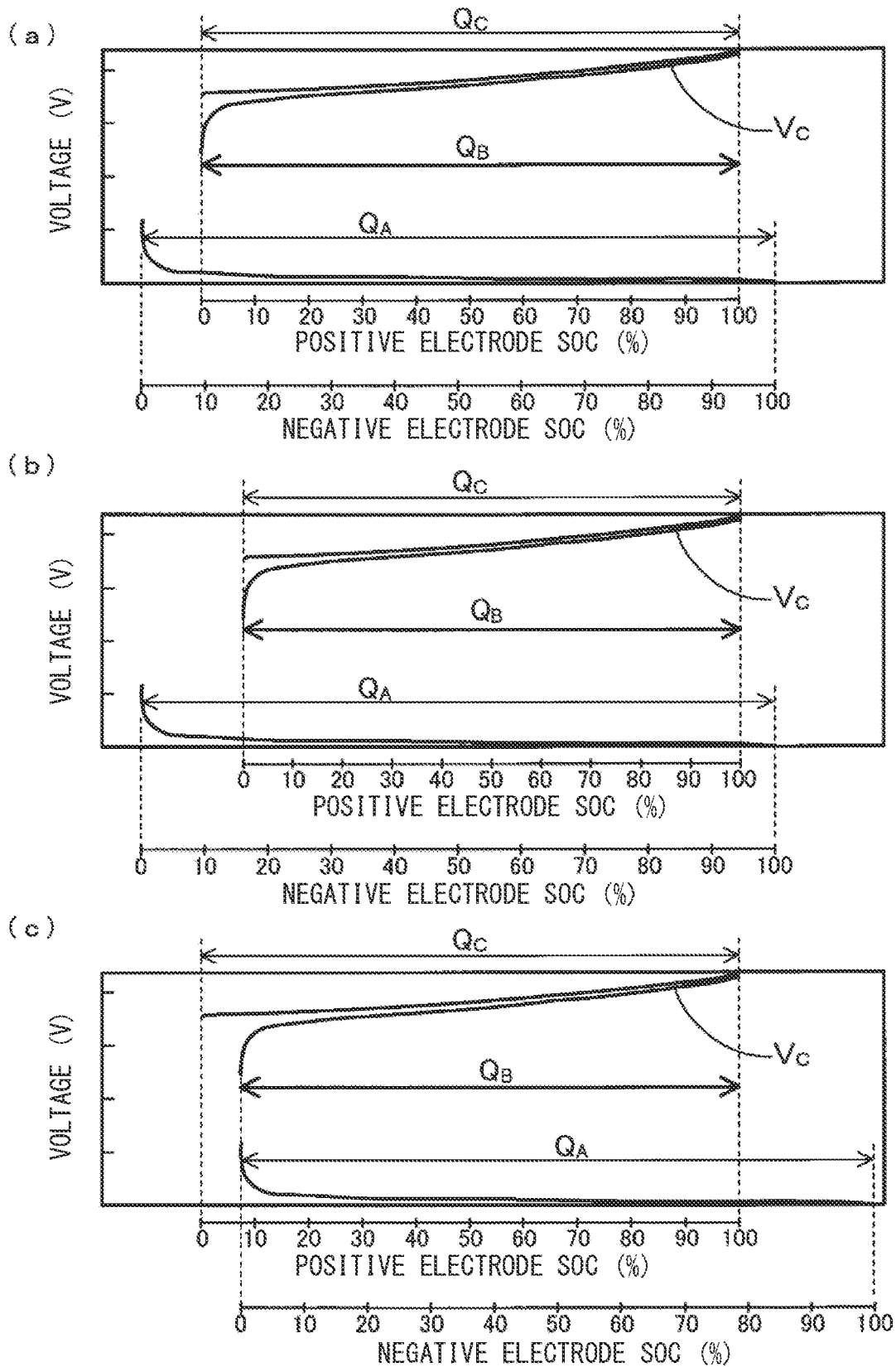
FIG. 20 is a conceptual diagram showing an SOC-OCV curve of a secondary battery according to a sixth embodiment.

In the first embodiment described above, the capacity estimation unit 62 serving as an estimation unit estimates the total capacity of the secondary battery module 2 on the basis of the battery characteristic acquired by the battery characteristic acquisition unit 61, but this is not restrictive. The capacity estimation unit 62 may estimate at least one of: a positive electrode capacity; a negative electrode capacity; an amount of deviation in a relative relationship between a negative electrode SOC and a positive electrode SOC; a variation in total capacity of a plurality of cells forming the secondary battery modules 21 to 26; a battery resistance of each of the secondary battery modules 21 to 26; a positive electrode resistance thereof; and a negative electrode resistance thereof. In the sixth embodiment, the capacity estimation unit 62 estimates the positive electrode capacity Qc of each of the secondary battery modules 21 to 26. In addition, the correspondence relationship memory unit 51 stores a correspondence relationship between a battery characteristic and a positive electrode capacity Qc. The correspondence relationship is not limited to any specific form or creation method, and may be in the form of, for example, a computation formula, a map, a graph, a table, or the like as in the first embodiment. The correspondence relationship can be created by machine learning through the use of the secondary battery 2 for measurement, created on the basis of an actual measurement value obtained by conducting an accelerated degradation test through the use of the secondary battery 2 for measurement, or created by a computation formula that logically derives the correspondence relationship between a battery characteristic and a total capacity in a predetermined voltage section through the use of a model of the secondary battery 2. In the present embodiment, the correspondence relationship memory unit 51 stores the correspondence relationship between a battery characteristic and a positive electrode capacity Qc based on the prediction models illustrated in (a) to (c) in FIG. 20. Other components are equivalent to those in the first embodiment and given the same reference signs as those in the first embodiment, and description thereof is omitted.

The following describes a method of assessing the degree of degradation conducted by the degradation degree assessment device 1 of the sixth embodiment. Note that steps similar to those in the first embodiment shown in FIG. 3 are given the same reference signs as those in the first embodiment and description thereof is sometimes omitted.

Figure 21:
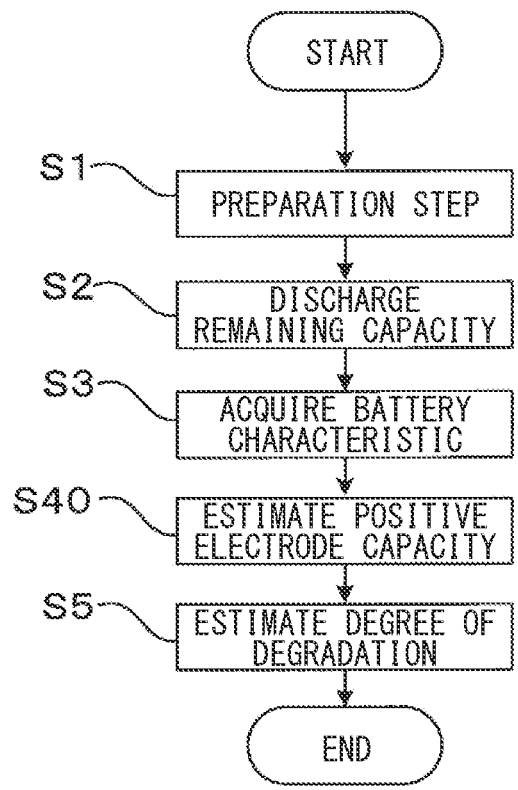
FIG. 21 is a flowchart showing a method of assessing the degree of degradation of a secondary battery according to the sixth embodiment.

In the sixth embodiment, first, steps S1 to S3 shown in FIG. 21 are performed as in the first embodiment shown in FIG. 3. As a result, as shown in (a) in FIG. 22, the battery characteristic acquisition unit 61 acquires a discharge curve as a battery characteristic of each of the secondary battery modules 21 to 26 in the predetermined voltage section Vs. The predetermined voltage section may be a section corresponding to a specific SOC range.

Next, in step S40 shown in FIG. 21, the capacity estimation unit 62 estimates the positive electrode capacity Qc of each of the secondary battery modules 21 to 26 on the basis of the prediction models stored in the correspondence relationship memory unit 51, on the basis of the correspondence relationship between a battery characteristic and a positive electrode capacity Qc, and from the discharge curve acquired by the battery characteristic acquisition unit 61. Then, in step S5 shown in FIG. 21, the assessment unit 63 assesses the degree of degradation of each of the secondary battery modules 21 to 26 on the basis of the positive electrode capacity Qc estimated by the capacity estimation unit 62.

Figure 22:
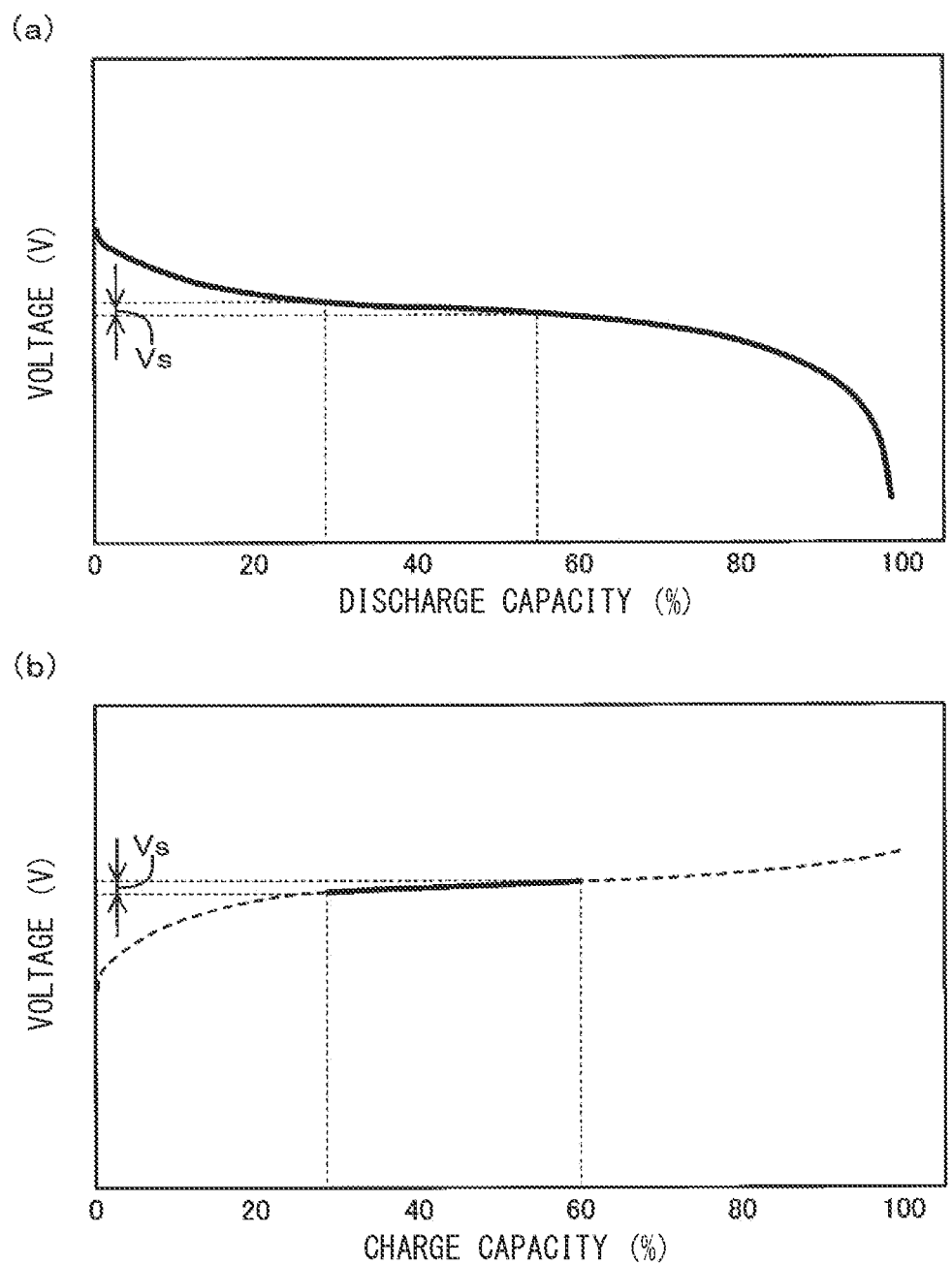
In FIG. 22, ($a$) is a conceptual diagram showing a discharge curve of a secondary battery and ($b$) is a conceptual diagram showing a charge curve of a secondary battery according to the sixth embodiment.

The sixth embodiment provides operation and effects similar to those of the first embodiment. In the sixth embodiment, the discharge curve shown in (a) in FIG. 22 is acquired by the battery characteristic acquisition unit 61. Alternatively, the charge curve shown in (b) in FIG. 22 may be acquired. In this case, operation and effects equivalent to those of the first embodiment are still provided.

Seventh Embodiment

Figure 23:
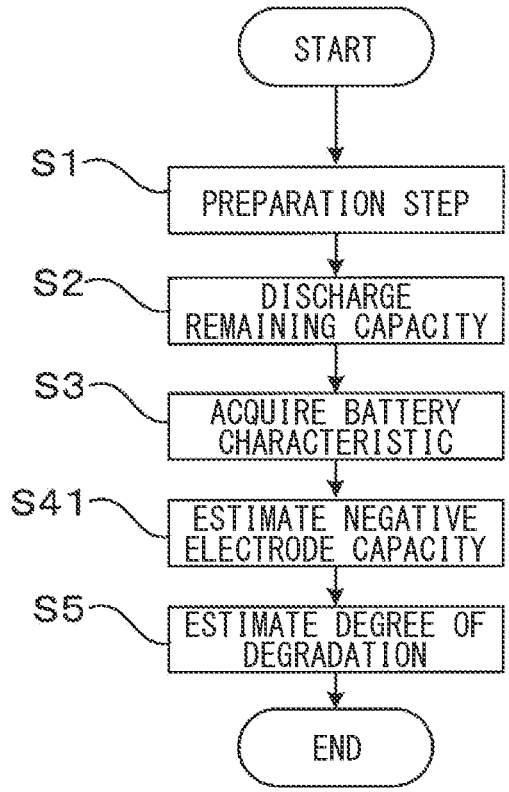
FIG. 23 is a flowchart showing a method of assessing the degree of degradation of a secondary battery according to a seventh embodiment.

In the sixth embodiment above, the capacity estimation unit 62 estimates a positive electrode capacity Qc. Instead thereof, in a seventh embodiment, the capacity estimation unit 62 estimates a negative electrode capacity QA. Specifically, in the seventh embodiment as shown in FIG. 23, in step S41, the negative electrode capacity QA of each of the secondary battery modules 21 to 26 is estimated on the basis of the prediction models shown in (a) to (c) in FIGS. 20 and on the basis of the correspondence relationship between a battery characteristic and a negative electrode capacity QA. The seventh embodiment provides operation and effects similar to those of the first embodiment.

Eighth Embodiment

In an eighth embodiment, the capacity estimation unit 62 estimates an amount of deviation in the relative relationship between the negative electrode SOC and the positive electrode SOC of each of the secondary battery modules 21 to 26. In addition, the correspondence relationship memory unit 51 stores a correspondence relationship between a battery characteristic and an amount of deviation in the relative relationship between the negative electrode SOC and the positive electrode SOC. The correspondence relationship is not limited to any specific form or creation method, and may be similar to the forms and creation methods in the first embodiment.

Figure 24:
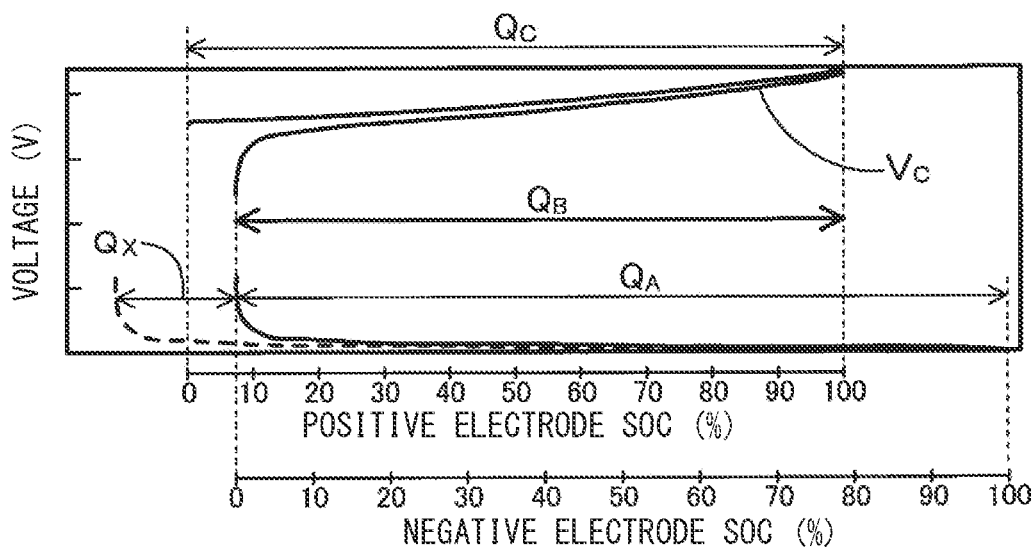
FIG. 24 is a conceptual diagram showing an SOC-OCV curve of a secondary battery according to an eighth embodiment.

For example, in a case where the secondary battery modules 21 to 26 are formed of nickel-metal hydride batteries, when hydrogen comes out of a reaction system from a battery container, there arises a deviation in the relative relationship between the negative electrode SOC and the positive electrode SOC, and thus the OCV curve of the negative electrode is shifted to the right of the figure as shown in FIG. 24. For example, in a case where the secondary battery modules 21 to 26 are formed of lithium-ion batteries, lithium in the electrolyte is consumed for forming a solid electrolyte interface (SEI) film to cause a deviation in the relative relationship between the negative electrode SOC and the positive electrode SOC, and thus the OCV curve of the negative electrode is shifted to the right of the figure as shown in FIG. 24.

In the eighth embodiment, the correspondence relationship memory unit 51 stores the correspondence relationship between a battery characteristic and an amount of deviation Qx in the relative relationship between the negative electrode SOC and the positive electrode SOC on the basis of the prediction model shown in FIG. 24. Other components are equivalent to those in the first embodiment and given the same reference signs as those in the first embodiment, and description thereof is omitted.

Figure 25:
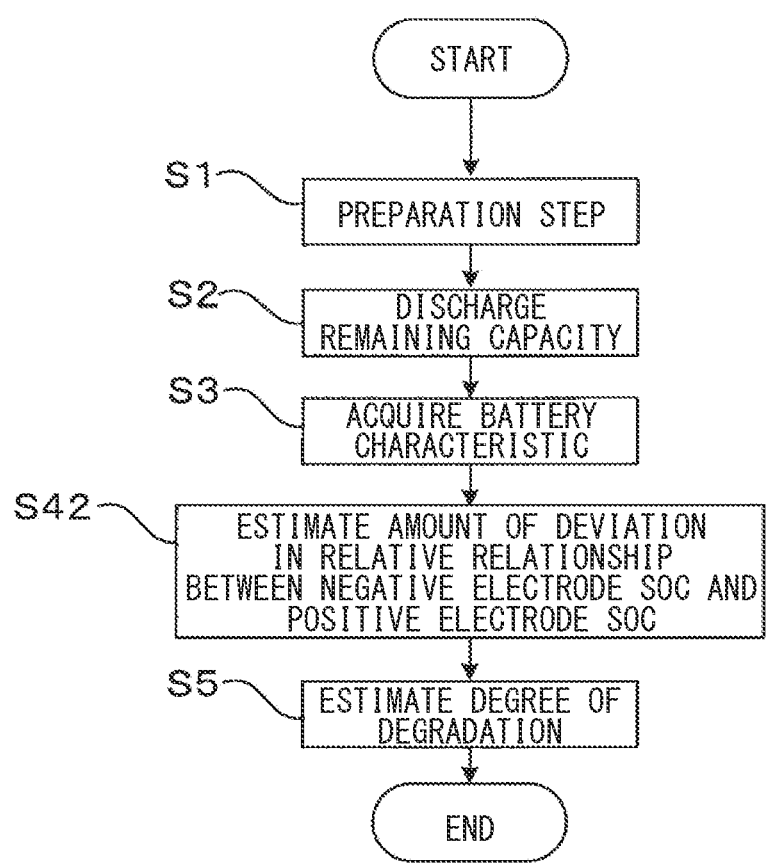
FIG. 25 is a flowchart showing a method of assessing the degree of degradation of a secondary battery according to a ninth embodiment.

The degradation degree assessment device 1 of the eighth embodiment carries out the method of assessing the degree of degradation in a similar manner to the manner in the sixth embodiment described above; provided, however, that, in step S3 as shown in FIG. 25, the battery characteristic acquisition unit 61 acquires, as a battery characteristic, a discharge curve in a predetermined voltage section Vs corresponding to a low SOC range of batteries. Then, in step S42, the amount of deviation Qx in each of the secondary battery modules 21 to 26 is estimated on the basis of the correspondence relationship between the battery characteristic computed from the discharge curve and the amount of deviation Qx in the relative relationship between the negative electrode SOC and the positive electrode SOC, as stored in the correspondence relationship memory unit 51. Then, in step S5 shown in FIG. 25, the assessment unit 63 assesses the degree of degradation of each of the secondary battery modules 21 to 26 on the basis of the amount of deviation Qx estimated by the capacity estimation unit 62. The present embodiment provides operation and effects similar to those of the first embodiment. In the eighth embodiment, the battery characteristic is acquired from a low SOC range of batteries. Alternatively, the battery characteristics may be acquired from a high SOC range. In the eighth embodiment, a discharge curve is acquired as a battery characteristic, but a charge curve may be acquired instead.

Ninth Embodiment

In a ninth embodiment, the correspondence relationship memory unit 51 stores the correspondence relationship between a battery characteristic and an amount of change in discharge capacity in a charge/discharge curve for each of the secondary battery modules 21 to 26, the capacity estimation unit 62 estimates the amount of change in discharge capacity in the charge/discharge curve in the predetermined voltage section Vs, and the assessment unit 63 detects, on the basis of an estimation result, whether the amount of self-discharge of a cell is increased, as the degree of degradation. In the ninth embodiment, other components are equivalent to those in the first embodiment and given the same reference signs as those in the first embodiment, and description thereof is omitted.

Figure 26:
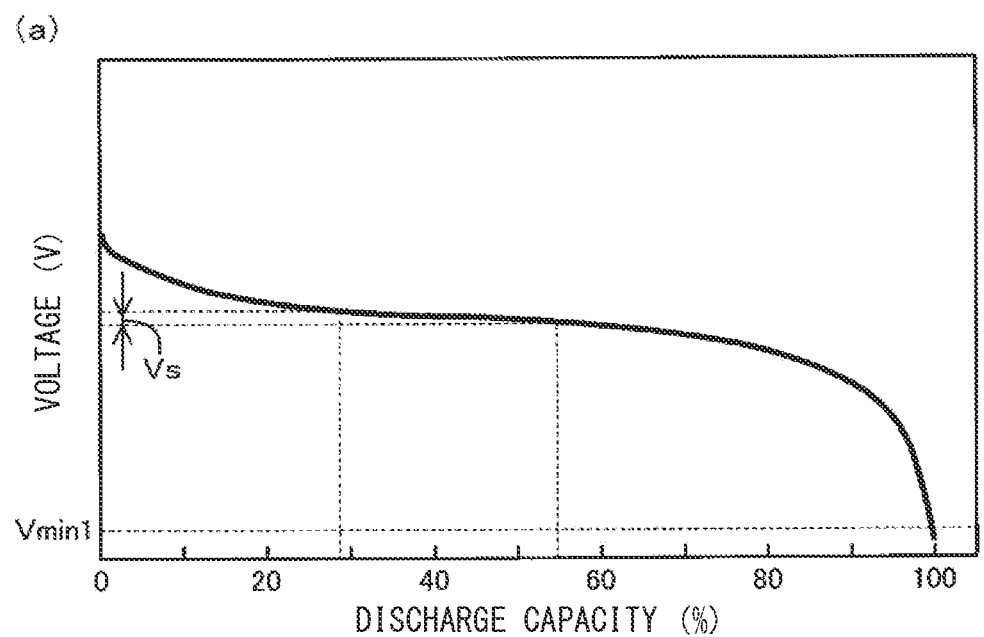
In FIG. 26, ($a$) is a conceptual diagram showing a discharge curve of a secondary battery and ($b$) is a conceptual diagram showing another discharge curve of a secondary battery according to the ninth embodiment.
Figure 26:
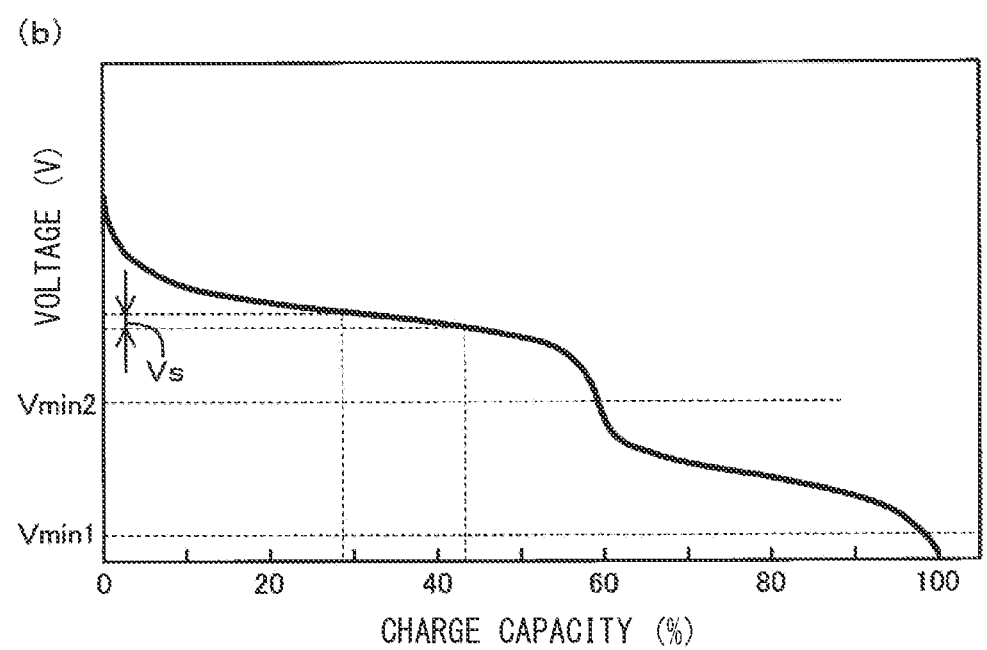

In the ninth embodiment, each of the secondary battery modules 21 to 26 has six cells. For example, the discharge curve shown in (a) in FIG. 26 is stored in the correspondence relationship memory unit 51 as a discharge curve indicating an initial state, and the discharge curve shown in (b) in FIG. 26 is stored in the correspondence relationship memory unit 51 as a discharge curve indicating that one of the cells has an increased amount of self-discharge. When the capacity estimation unit 62 estimates the discharge curve shown in (a) in FIG. 26 on the basis of the battery characteristic in the predetermined voltage section Vs, the assessment unit 63 determines that there is no cell having an increased amount of self-discharge. On the other hand, when the capacity estimation unit 62 estimates the discharge curve shown in (b) in FIG. 26 on the basis of the battery characteristic in the predetermined voltage section Vs, the assessment unit 63 determines that there is a cell having an increased amount of self-discharge. When the discharge curve shown in (b) in FIG. 26 is estimated, the usage lower limit can be set to a second usage lower limit Vmin2, which is higher than a first usage lower limit Vmin1 used for the case where the secondary battery module has no cell having an increased amount of self-discharge. As a result, each cell can be prevented from being excessively discharged.

Tenth Embodiment

Figure 27:
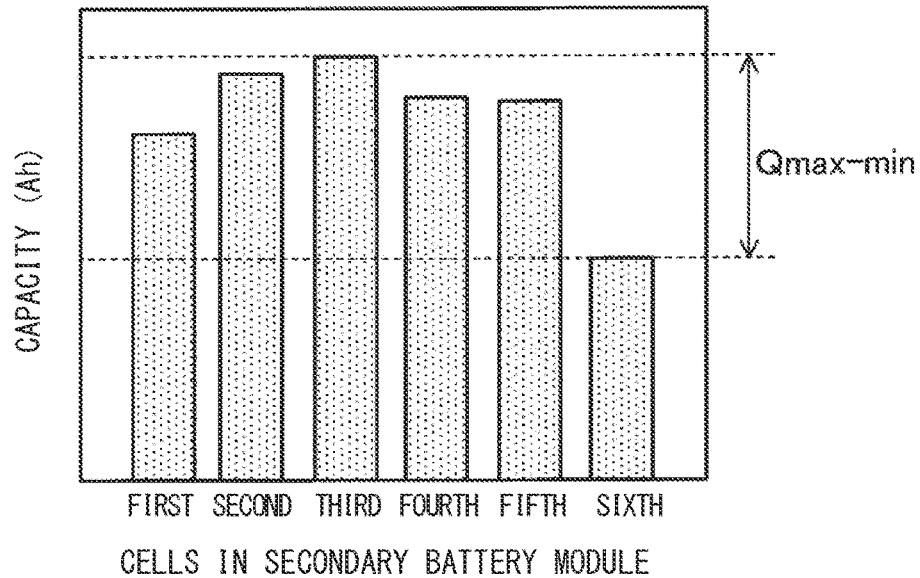
FIG. 27 is a conceptual diagram showing an example of an estimation result according to a tenth embodiment.

In a tenth embodiment, each of the secondary battery modules 21 to 26 includes six cells. The correspondence relationship memory unit 51 stores the correspondence relationship between a battery characteristic and variations in total capacity of cells in each of the secondary battery modules 21 to 26. Variations in total capacity of cells indicate the degree of variations in total capacity of a plurality of the individual cells included in each of the secondary battery modules 21 to 26. In the tenth embodiment, as shown in FIG. 27, a difference Qmax-min obtained by subtracting a minimum Qmin from a maximum Qmax in the total capacities of the plurality of cells is employed as variations in total capacity of cells. Other components are equivalent to those in the first embodiment and given the same reference signs as those in the first embodiment, and description thereof is omitted.

In the tenth embodiment, on the basis of the battery characteristic acquired by the battery characteristic acquisition unit 61, the capacity estimation unit 62 estimates a difference Qmax-min from the correspondence relationship stored in the correspondence relationship memory unit 51. Then, the assessment unit 63 detects presence or absence of capacity degradation specific to any cell, on the basis of the estimated difference Qmax-min. For example, when it is determined that the estimated difference Qmax-min is equal to or greater than a predetermined value, it is determined that capacity degradation specific to any one of the cells in the secondary battery module has occurred.

Eleventh Embodiment

Figure 28:
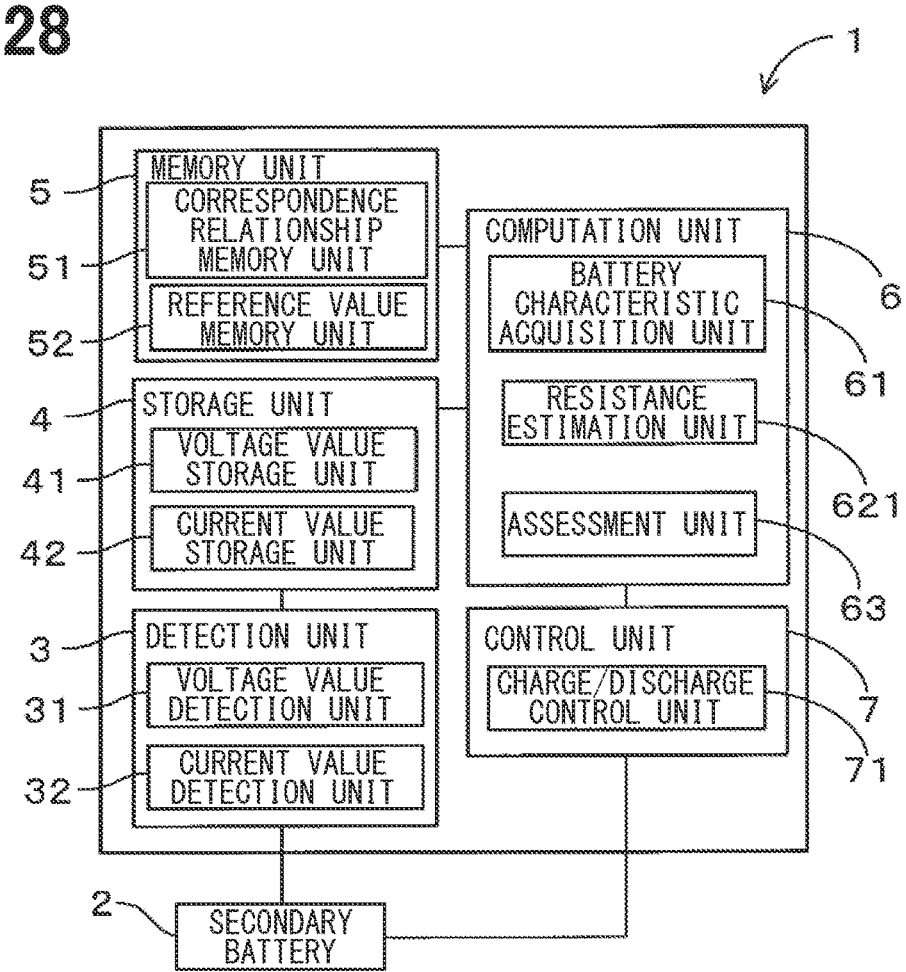
FIG. 28 is a conceptual diagram showing a configuration of a degradation degree assessment device according to an eleventh embodiment.

As shown in FIG. 28, in an eleventh embodiment, a resistance estimation unit 621 serving as an estimation unit is included. The resistance estimation unit 621 estimates an internal resistance of each of the secondary battery modules 21 to 26 on the basis of battery characteristics of the secondary battery modules 21 to 26. The correspondence relationship memory unit 51 stores a correspondence relationship between an internal resistance and a battery characteristic of each of the secondary battery modules 21 to 26. The battery characteristic acquisition unit 61 is capable of acquiring battery characteristics by performing pulsed charge/discharge in the state where the secondary battery modules 21 to 26 are connected to form a stack. The voltage section from which battery characteristics are to be acquired may be a predetermined voltage section corresponding to a specific SOC range.

In a case where the secondary battery modules 21 to 26 are different in terms of temperature or SOC, a temperature and a voltage change during charge/discharge or a voltage change during voltage relaxation after the charge/discharge may be acquired as battery characteristics, and then a resistance value under the same temperature and SOC conditions can be estimated. In this case, it is assumed that the correspondence relationship memory unit 51 stores a correspondence relationship among an internal resistance, a temperature, and a battery characteristic of each of the secondary battery modules 21 to 26. Alternatively, battery characteristics may be acquired by individually charging/discharging the secondary battery modules 21 to 26. In this case, the assessment time can be shortened because of no need to adjust temperatures and SOCs to the same conditions.

Figure 29:
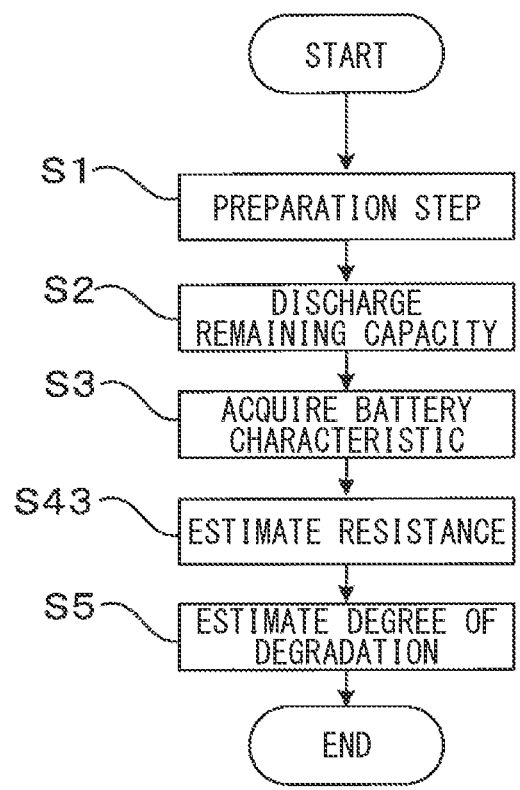
FIG. 29 is a flowchart showing a method of assessing the degree of degradation of a secondary battery according to the eleventh embodiment.

The following describes a method of assessing the degree of degradation conducted by the degradation degree assessment device 1 of the eleventh embodiment. In the eleventh embodiment, first, steps S1 to S3 shown in FIG. 29 are performed as in the first embodiment shown in FIG. 3. Next, in step S43 shown in FIG. 29, the resistance estimation unit 621 estimates the internal resistance of each of the secondary battery modules 21 to 26 from the battery characteristics acquired by the battery characteristic acquisition unit 61 and on the basis of the correspondence relationship between an internal resistance and a battery characteristic of each of the secondary battery modules 21 to 26 stored in the correspondence relationship memory unit 51. Then, in step S5 shown in FIG. 29, the assessment unit 63 assesses the degree of degradation of each of the secondary battery modules 21 to 26 on the basis of the internal resistance estimated by the resistance estimation unit 621. The eleventh embodiment provides operation and effects similar to those of the first embodiment.

Twelfth Embodiment

In the degradation degree assessment device 1 of a twelfth embodiment, the resistance estimation unit 621 estimates the negative electrode resistances of the secondary battery modules 21 to 26, and the assessment unit 63 assesses the degrees of degradation of the secondary battery modules 21 to 26.

Resistance values of the positive electrode, the negative electrode, and other battery elements in the secondary battery modules 21 to 26 can be computed from frequency characteristics in voltage curves representing the secondary battery modules 21 to 26. For a nickel-metal hydride battery or a lithium-ion battery, the negative electrode resistance is remarkably reflected in a high frequency region and the positive electrode resistance is remarkably reflected in a low frequency region in a voltage curve. In the twelfth embodiment, nickel-metal hydride batteries are used as the secondary battery modules 21 to 26, and the battery characteristic acquisition unit 61 acquires, as a battery characteristic, a voltage curve in a predetermined voltage section of a high frequency region. The correspondence relationship memory unit 51 stores in advance a correspondence relationship between a voltage curve in a high frequency region, as a battery characteristic, and a negative electrode resistance. Other components are similar to those in the eleventh embodiment and given the same reference signs as those in the eleventh embodiment, and description thereof is omitted.

In the internal resistances correlated with the degrees of degradation of the secondary battery modules 21 to 26, the dominant resistance elements differ depending on the degradation mode. First, the internal resistance of the secondary battery module is determined by the relationship among three resistance components: electronic resistance, reaction resistance, and internal mass transfer resistance. The secondary battery module can be regarded as a series equivalent circuit of these three resistance components. In general, electronic resistance is a resistance component mainly generated in a time region immediately after a constant current is applied to the battery. Reaction resistance is a resistance component mainly generated in a time region after the time region in which electron resistance is generated. Internal mass transfer resistance is a resistance component generated when a constant current is applied for a long time, mainly in a time region after the time region of reaction resistance. In addition, the negative electrode reaction resistance dominant region is a time region in which the negative electrode reaction resistance has the highest proportion in the discharge period among the three resistance components. In the negative electrode reaction resistance dominant region, the negative electrode reaction resistance dominantly determines the internal resistance of the secondary battery 2. In the twelfth embodiment, the assessment unit 63 assesses, in the negative electrode reaction resistance dominant region, the degree of degradation of each of the secondary battery modules 21 to 26 on the basis of the negative electrode resistance estimated by the resistance estimation unit 621.

A method of assessing the degree of degradation performed by the degradation degree assessment device 1 of the twelfth embodiment includes steps S1 to S3 shown in FIG. 29, as in the eleventh embodiment. Then, in step S43, the resistance estimation unit 621 estimates the negative electrode resistance of each of the secondary battery modules 21 to 26 on the basis of the voltage curve acquired by the battery characteristic acquisition unit 61 and of the correspondence relationship stored in the correspondence relationship memory unit 51. Then, the assessment unit 63 assesses the degree of degradation of each of the secondary battery modules 21 to 26 from the estimated negative electrode resistance. The twelfth embodiment provides operation and effects similar to those of the first embodiment.

Thirteenth Embodiment

In the degradation degree assessment device 1 of a thirteenth embodiment, the resistance estimation unit 621 estimates the positive electrode resistances of the secondary battery modules 21 to 26, and the assessment unit 63 assesses the degrees of degradation of the secondary battery modules 21 to 26. In the thirteenth embodiment, nickel-metal hydride batteries are used as the secondary battery modules 21 to 26, and the battery characteristic acquisition unit 61 acquires, as a battery characteristic, a voltage curve in a predetermined voltage section of a low frequency region. The correspondence relationship memory unit 51 stores in advance the correspondence relationship between a voltage curve as a battery characteristic and a positive electrode resistance. The assessment unit 63 assesses, in the positive electrode reaction resistance dominant region, the degree of degradation of each of the secondary battery modules 21 to 26 on the basis of the positive electrode resistance estimated by the resistance estimation unit 621. Other components are similar to those in the twelfth embodiment and given the same reference signs as those in the twelfth embodiment, and description thereof is omitted.

A method of assessing the degree of degradation performed by the degradation degree assessment device 1 of the thirteenth embodiment includes steps S1 to S3 shown in FIG. 29, as in the twelfth embodiment. Then, in step S43, the resistance estimation unit 621 estimates the positive electrode resistance of each of the secondary battery modules 21 to 26 on the basis of the voltage curve acquired by the battery characteristic acquisition unit 61 and of the correspondence relationship stored in the correspondence relationship memory unit 51. Then, the assessment unit 63 assesses the degree of degradation of each of the secondary battery modules 21 to 26 from the estimated positive electrode resistance. The thirteenth embodiment provides operation and effects similar to those of the first embodiment.

The present disclosure is not limited to the embodiments described above, and can be applied to various embodiments without departing from the gist of the present disclosure.

Although the present disclosure has been described with reference to the embodiments, it is understood that the present disclosure is not limited to the embodiments or structures. The present disclosure includes various modifications and variations within the scope of equivalents. In addition, various combinations and forms, as well as other combinations and forms that include only one element, more than one element, or less than one element are within the scope and spirit of the present disclosure.

The control units and methods described in the present disclosure may be implemented by a special purpose computer created by configuring a processor programmed to execute one or more particular functions embodied in computer programs.

What is claimed is:

1. A degradation degree assessment device for a secondary battery to assess a degree of degradation of the secondary battery, the degradation degree assessment device comprising:
   a battery characteristic acquisition unit configured to acquire a battery characteristic, which relates to a transition of a battery state in a whole voltage section of the secondary battery from a discharge start voltage to a discharge target voltage (VP); and
   an assessment unit configured to assess the degree of degradation of the secondary battery based on the battery characteristic, which is acquired by the battery characteristic acquisition unit, or based on a battery characteristic-related value, which is computed based on the battery characteristic in a predetermined voltage section that is within the whole voltage section and defined by
   a section between an upper limit voltage (V2), which is less than the discharge start voltage, and the discharge target voltage,
       a section between the discharge start voltage and a lower limit voltage (V1), which is greater than the discharge target voltage (VP), or
       a section between the upper limit voltage (V2) and the lower limit voltage (V1), wherein
   the battery characteristic includes a discharge voltage characteristic, which is based on at least one of:
       a voltage transition during discharge of the secondary battery to the discharge target voltage; or
       a voltage transition after the secondary battery is discharged to the discharge target voltage and stops being discharged, and
   the voltage transition is computed based on at least one of:
       a section capacity of the secondary battery in the predetermined voltage section;
       a rate of a voltage change of the secondary battery with respect to a capacity change of the secondary battery in the voltage section;
       a rate of a voltage change of the secondary battery with respect to an elapsed time in the voltage section; or
       a capacity ratio of the section capacity in the voltage section with respect to a total discharge capacity in a case of discharge to the discharge target voltage.

2. The degradation degree assessment device for a secondary battery according to claim 1, wherein
   the battery characteristic includes a charge voltage characteristic, which is based on at least one of:
       a voltage transition during charge of the secondary battery to a predetermined charge target voltage; or
       a voltage transition after the secondary battery is charged to the charge target voltage and stops being charged.

3. The degradation degree assessment device for a secondary battery according to claim 1, wherein
   the predetermined voltage section is a section in which a difference in the discharge voltage characteristic depends on the degree of degradation of the secondary battery, and
   the predetermined voltage section is
       a section that exhibits a high correlation between the degree of degradation of the secondary battery and the transition of the battery state,
       a section that is set on the basis of a type or a configuration of the secondary battery, and/or
       a section that is derived by machine learning through use of the secondary battery.

4. The degradation degree assessment device for a secondary battery according to claim 1, wherein
   at least a part of the predetermined voltage section is included in a range from the discharge target voltage to a lower limit value of a voltage value of the secondary battery in a use range.

5. The degradation degree assessment device for a secondary battery according to claim 1, further comprising:
   an impedance characteristic acquisition unit configured to acquire an impedance characteristic, which relates to an impedance when the secondary battery is discharged or charged, wherein
   the assessment unit is configured to assess the degree of degradation based on the impedance characteristic, which is acquired by the impedance characteristic acquisition unit, or an impedance characteristic-related value, which is computed from the impedance characteristic, and based on the battery characteristic or the battery characteristic-related value.

6. The degradation degree assessment device for a secondary battery according to claim 1, further comprising:
   an initial voltage acquisition unit configured to acquire an initial voltage, which is an open circuit voltage of the secondary battery when the battery characteristic acquisition unit starts acquiring the battery characteristic, wherein
   the assessment unit is configured to assess the degree of degradation based on the initial voltage, which is acquired by the initial voltage acquisition unit, or an initial voltage-related value, which is computed based on the initial voltage, and based on the battery characteristic or the battery characteristic-related value.

7. The degradation degree assessment device for a secondary battery according to claim 1, wherein
   the battery characteristic acquisition unit includes a temperature detection unit configured to detect a temperature of the secondary battery,
   the battery characteristic includes a temperature characteristic, which is based on a temperature transition of the secondary battery in the predetermined voltage section, and
   the temperature transition is acquired by the temperature detection unit.

8. The degradation degree assessment device for a secondary battery according to claim 1, further comprising
   an estimation unit configured to estimate, as the battery characteristic-related value, from the battery characteristic, at least one of:
       a total capacity of the secondary battery;
       a positive electrode capacity of the secondary battery;
       a negative electrode capacity of the secondary battery;
       an amount of deviation in a relative relationship between a negative electrode SOC and a positive electrode SOC of the secondary battery;
       a variation in total capacity of a plurality of cells included in the secondary battery;
       a battery resistance of the secondary battery;
       a positive electrode resistance of the secondary battery; or a negative electrode resistance of the secondary battery, wherein the assessment unit is configured to assess the degree of degradation of the secondary battery based on a result of estimation by the estimation unit.

9. A degradation degree assessment device for a secondary battery to assess a degree of degradation of the secondary battery, the degradation degree assessment device comprising:

a battery characteristic acquisition unit configured to acquire a battery characteristic, which relates to a transition of a battery state in a whole voltage section of the secondary battery from a charge start voltage (VP) to a charge target voltage (VQ); and an assessment unit configured to assess the degree of degradation of the secondary battery based on the battery characteristic, which is acquired by the battery characteristic acquisition unit, or based on a battery characteristic-related value, which is computed based on the battery characteristic in a predetermined voltage section that is within the whole voltage section and defined by a section between the charge start voltage (VP) and an upper limit voltage (V4), which is less than the charge target voltage (VQ), a section between a lower limit voltage (V3), which is greater than the charge start voltage (VP), and the charge target voltage (VQ), or a section between the lower limit voltage (V3) and the upper limit voltage (V4), wherein the battery characteristic includes a charge voltage characteristic, which is based on at least one of:

a voltage transition during charge of the secondary battery to the charge target voltage; or a voltage transition after the secondary battery is charged to the charge target voltage and stops being charged, and the voltage transition is computed based on at least one of:

a section capacity of the secondary battery in the voltage section;

a rate of a voltage change of the secondary battery with respect to a capacity change of the secondary battery in the voltage section;

a rate of a voltage change of the secondary battery with respect to an elapsed time in the voltage section; or a capacity ratio of the section capacity in the voltage section with respect to a total charge capacity in a case of charge to the charge target voltage.

10. The degradation degree assessment device for a secondary battery according to claim 9, wherein the predetermined voltage section is a section in which a difference in the charge voltage characteristic depends on the degree of degradation of the secondary battery, and the predetermined voltage section is a section that exhibits a high correlation between the degree of degradation of the secondary battery and the transition of the battery state, a section that is set on the basis of a type or a configuration of the secondary battery, and/or a section that is derived by machine learning through use of the secondary battery.

11. The degradation degree assessment device for a secondary battery according to claim 9, wherein at least a part of the predetermined voltage section is included in a range from the charge target voltage to a lower limit value of a voltage value of the secondary battery in a use range.

12. An assembled battery comprising:

a plurality of secondary batteries, wherein the secondary batteries include a recycled product, and in the secondary batteries, a battery characteristic or a battery characteristic-related value is within a predetermined range, wherein the battery characteristic relates to a transition of a battery state of each of the secondary batteries in a predetermined voltage section that is within a whole voltage section from a discharge start voltage to a discharge target voltage (VP), a battery voltage is acquired in the whole voltage section, the predetermined voltage section is defined by a section between an upper limit voltage (V2), which is less than the discharge start voltage, and the discharge target voltage, a section between the discharge start voltage and a lower limit voltage (V1), which is greater than the discharge target voltage (VP), or a section between the upper limit voltage (V2) and the lower limit voltage (V1), and the battery characteristic-related value is computed based on the battery characteristic, the battery characteristic includes a discharge voltage characteristic, which is based on at least one of:

a voltage transition during discharge of each of the secondary batteries to a the discharge target voltage; or a voltage transition after each of the secondary batteries is discharged to the discharge target voltage and stops being discharged, and the voltage transition is computed based on at least one of:

an amount of capacity change of each of the secondary batteries in the predetermined voltage section;

a rate of a voltage change of each of the secondary batteries with respect to a capacity change of each of the secondary batteries in the predetermined voltage section;

a rate of a voltage change of each of the secondary batteries with respect to an elapsed time in the predetermined voltage section; or a capacity ratio of a section capacity in the predetermined voltage section with respect to a total discharge capacity in a case of discharge to the discharge target voltage.

13. The assembled battery according to claim 12, wherein in the secondary batteries, the battery characteristic or the battery characteristic-related value is within a predetermined range, wherein the battery characteristic includes a charge voltage characteristic based on at least one of:

a voltage transition, which is caused by charge and during charge of each of the secondary batteries to a predetermined charge target voltage; or a voltage transition after each of the secondary batteries is charged to the charge target voltage and stops being charged.

14. The assembled battery according to claim 12, wherein
the predetermined voltage section is a section in which
a difference in the discharge voltage characteristic
depends on a degree of degradation of the secondary
battery, and
the predetermined voltage section is
a section that exhibits a high correlation between the
degree of degradation of the secondary battery and
the transition of the battery state,
a section that is set on the basis of a type or a
configuration of the secondary battery, and/or
a section that is derived by machine learning through
use of the secondary battery.

15. The assembled battery according to claim 12, wherein
at least a part of the predetermined voltage section is
included in a range from the discharge target voltage to
a lower limit value of a voltage value of the secondary
battery in a use range.

16. The assembled battery according to claim 12, wherein
in the secondary batteries, an impedance characteristic or
an impedance characteristic-related value is within a
predetermined range, wherein
the impedance characteristic relates to an impedance
when each of the secondary batteries is discharged or
charged, and
the impedance characteristic-related value is computed
based on the impedance characteristic.

17. The assembled battery according to claim 12, wherein
in the secondary batteries, an initial voltage or an initial
voltage-related value is within a predetermined range,
wherein
the initial voltage is an open circuit voltage of each of the
secondary batteries when acquisition of the battery
characteristic is started, and
the initial voltage-related value is computed based on the
initial voltage.

18. The assembled battery according to claim 12, wherein
in the secondary batteries, the battery characteristic or the
battery characteristic-related value is within a prede-
termined range, wherein
the battery characteristic includes a temperature charac-
teristic, which is based on a temperature transition of
each of the secondary batteries in the predetermined
voltage section.

19. The assembled battery according to claim 12, wherein
the battery characteristic-related value is a degree of
degradation, which is assessed based on at least one of
the following that are estimated from the battery char-
acteristic:
a total capacity of each of the secondary batteries;
a positive electrode capacity of each of the secondary
batteries;
a negative electrode capacity of each of the secondary
batteries;
an amount of deviation in a relative relationship
between a negative electrode SOC and a positive
electrode SOC of each of the secondary batteries;
a variation in total capacity of a plurality of cells
included in each of the secondary batteries;
a battery resistance of each of the secondary batteries;
a positive electrode resistance of each of the secondary
batteries; or
a negative electrode resistance of each of the secondary
batteries.

20. An assembled battery comprising:
a plurality of secondary batteries, wherein
the secondary batteries include a recycled product, and
in the secondary batteries, a battery characteristic or a
battery characteristic-related value is within a pre-
determined range, wherein
the battery characteristic relates to a transition of a battery
state of each of the secondary batteries in a predeter-
mined voltage section that is within a whole voltage
section from a charge start voltage (VP) to a charge
target voltage (VQ),
a battery voltage is acquired in the whole voltage section,
the predetermined voltage section is defined by
a section between the charge start voltage (VP) and an
upper limit voltage (V4), which is less than the
charge target voltage (VQ),
a section between a lower limit voltage (V3), which is
greater than the charge start voltage (VP), and the
charge target voltage (VQ), or
a section between the lower limit voltage (V3) and the
upper limit voltage (V4), and
the battery characteristic-related value is computed
based on the battery characteristic,
the battery characteristic includes a charge voltage
characteristic based on at least one of:
a voltage transition, which is caused by charge and
during charge of each of the secondary batteries to
a predetermined charge target voltage; or
a voltage transition after each of the secondary
batteries is charged to the charge target voltage
and stops being charged, and
the voltage transition is computed based on at least one
of:
an amount of capacity change of each of the sec-
ondary batteries in the predetermined voltage sec-
tion;
a rate of a voltage change of each of the secondary
batteries with respect to a capacity change of each
of the secondary batteries in the predetermined
voltage section;
a rate of a voltage change of each of the secondary
batteries with respect to an elapsed time in the
predetermined voltage section; or
a capacity ratio of a section capacity in the prede-
termined voltage section with respect to a total
charge capacity in a case of charge to the charge
target voltage.

21. The assembled battery according to claim 20, wherein
the predetermined voltage section is a section in which a
difference in the charge voltage characteristic depends
on a degree of degradation of the secondary battery, and
the predetermined voltage section is
a section that exhibits a high correlation between the
degree of degradation of the secondary battery and
the transition of the battery state,
a section that is set on the basis of a type or a
configuration of the secondary battery, and/or
a section that is derived by machine learning through
use of the secondary battery.

22. The assembled battery according to claim 20, wherein
at least a part of the predetermined voltage section is
included in a range from the charge target voltage to a
lower limit value of a voltage value of the secondary
battery in a use range.

23. A degradation degree assessment device for a second-
ary battery to assess a degree of degradation of the second-
ary battery, the degradation degree assessment device com-
prising:
a battery characteristic acquisition unit configured to
acquire a battery characteristic, which relates to a transition of a battery state in a predetermined voltage section of the secondary battery; and an assessment unit configured to assess the degree of degradation of the secondary battery based on the battery characteristic, which is acquired by the battery characteristic acquisition unit, or based on a battery characteristic-related value, which is computed based on the battery characteristic, wherein the battery characteristic includes a discharge voltage characteristic, which is based on at least one of:
  a voltage transition during discharge of the secondary battery to a predetermined discharge target voltage; or
  a voltage transition after the secondary battery is discharged to the discharge target voltage and stops being discharged, and the voltage transition is computed based on at least one of:
  a section capacity of the secondary battery in the predetermined voltage section;
  a rate of a voltage change of the secondary battery with respect to a capacity change of the secondary battery in the predetermined voltage section;
  a rate of a voltage change of the secondary battery with respect to an elapsed time in the predetermined voltage section; or
  a capacity ratio of the section capacity in the predetermined voltage section with respect to a total discharge capacity in a case of discharge to the discharge target voltage, the predetermined voltage section is a section in which a difference in the discharge voltage characteristic depends on the degree of degradation of the secondary battery, and the predetermined voltage section is
  a section that exhibits a high correlation between the degree of degradation of the secondary battery and the transition of the battery state,
  a section that is set on the basis of a type or a configuration of the secondary battery, and/or
  a section that is derived by machine learning through use of the secondary battery.

24. A degradation degree assessment device for a secondary battery to assess a degree of degradation of the secondary battery, the degradation degree assessment device comprising:
  a battery characteristic acquisition unit configured to acquire a battery characteristic, which relates to a transition of a battery state in a predetermined voltage section of the secondary battery; and
  an assessment unit configured to assess the degree of degradation of the secondary battery based on the battery characteristic, which is acquired by the battery characteristic acquisition unit, or based on a battery characteristic-related value, which is computed based on the battery characteristic, the battery characteristic includes a charge voltage characteristic, which is based on at least one of:
  a voltage transition during charge of the secondary battery to a predetermined charge target voltage; or
  a voltage transition after the secondary battery is charged to the charge target voltage and stops being charged, and the voltage transition is computed based on at least one of:
  a section capacity of the secondary battery in the predetermined voltage section;
  a rate of a voltage change of the secondary battery with respect to a capacity change of the secondary battery in the predetermined voltage section;
  a rate of a voltage change of the secondary battery with respect to an elapsed time in the predetermined voltage section; or
  a capacity ratio of the section capacity in the predetermined voltage section with respect to a total charge capacity in a case of charge to the charge target voltage, the predetermined voltage section is a section in which a difference in the charge voltage characteristic depends on the degree of degradation of the secondary battery, and the predetermined voltage section is
  a section that exhibits a high correlation between the degree of degradation of the secondary battery and the transition of the battery state,
  a section that is set on the basis of a type or a configuration of the secondary battery, and/or
  a section that is derived by machine learning through use of the secondary battery.

25. An assembled battery comprising:
a plurality of secondary batteries, wherein
the secondary batteries include a recycled product, and
in the secondary batteries, a battery characteristic or a battery characteristic-related value is within a predetermined range, wherein the battery characteristic relates to a transition of a battery state of each of the secondary batteries in a predetermined voltage section, and the battery characteristic-related value is computed based on the battery characteristic, the battery characteristic includes a discharge voltage characteristic, which is based on at least one of:
  a voltage transition during discharge of each of the secondary batteries to a predetermined discharge target voltage; or
  a voltage transition after each of the secondary batteries is discharged to the discharge target voltage and stops being discharged, and the voltage transition is computed based on at least one of:
  an amount of capacity change of each of the secondary batteries in the predetermined voltage section;
  a rate of a voltage change of each of the secondary batteries with respect to a capacity change of each of the secondary batteries in the predetermined voltage section;
  a rate of a voltage change of each of the secondary batteries with respect to an elapsed time in the predetermined voltage section; or
  a capacity ratio of a section capacity in the predetermined voltage section with respect to a total discharge capacity in a case of discharge to the discharge target voltage, the predetermined voltage section is a section in which a difference in the discharge voltage characteristic depends on the degree of degradation of the secondary battery, and the predetermined voltage section is
  a section that exhibits a high correlation between the degree of degradation of the secondary battery and the transition of the battery state,
  a section that is set on the basis of a type or a configuration of the secondary battery, and/or
  a section that is derived by machine learning through use of the secondary battery.

26. An assembled battery comprising:
a plurality of secondary batteries, wherein
the secondary batteries include a recycled product, and
in the secondary batteries, a battery characteristic or a battery characteristic-related value is within a predetermined range, wherein
the battery characteristic relates to a transition of a battery state of each of the secondary batteries in a predetermined voltage section, and
the battery characteristic-related value is computed based on the battery characteristic,
the battery characteristic includes a charge voltage characteristic based on at least one of:
  a voltage transition, which is caused by charge and during charge of each of the secondary batteries to a predetermined charge target voltage; or
  a voltage transition after each of the secondary batteries is charged to the charge target voltage and stops being charged, and
the voltage transition is computed based on at least one of:
  an amount of capacity change of each of the secondary batteries in the predetermined voltage section;
  a rate of a voltage change of each of the secondary batteries with respect to a capacity change of each of the secondary batteries in the predetermined voltage section;
  a rate of a voltage change of each of the secondary batteries with respect to an elapsed time in the predetermined voltage section; or
  a capacity ratio of a section capacity in the predetermined voltage section with respect to a total charge capacity in a case of charge to the charge target voltage,
the predetermined voltage section is a section in which a difference in the charge voltage characteristic depends on the degree of degradation of the secondary battery, and
the predetermined voltage section is
  a section that exhibits a high correlation between the degree of degradation of the secondary battery and the transition of the battery state,
  a section that is set on the basis of a type or a configuration of the secondary battery, and/or
  a section that is derived by machine learning through use of the secondary battery.

* * * * *